(12) United States Patent
Senn et al.

(10) Patent No.: US 9,608,142 B2
(45) Date of Patent: Mar. 28, 2017

(54) OPTOELECTRONIC MODULES WITH OPTICS INTEGRATED INTO A CAP

(71) Applicant: Heptagon Micro Optics Pte. Ltd., Singapore (SG)

(72) Inventors: Tobias Senn, Zurich (CH); Hartmut Rudmann, Jona (CH)

(73) Assignee: Heptagon Micro Optics Pte. Ltd., Singapore (SG)

(*) Notice: Subject to any disclaimer, the term of this patent is extended or adjusted under 35 U.S.C. 154(b) by 0 days.

(21) Appl. No.: 15/041,216

(22) Filed: Feb. 11, 2016

(65) Prior Publication Data

US 2016/0254397 A1  Sep. 1, 2016

Related U.S. Application Data

(60) Provisional application No. 62/121,654, filed on Feb. 27, 2015.

(51) Int. Cl.
| | | |
|---|---|---|
| H01L 21/00 | (2006.01) |
| H01L 33/00 | (2010.01) |
| H01L 31/0232 | (2014.01) |
| G02B 7/00 | (2006.01) |
| H01L 33/58 | (2010.01) |
| H01L 31/18 | (2006.01) |

(52) U.S. Cl.
CPC ........ H01L 31/02325 (2013.01); G02B 7/003 (2013.01); H01L 31/18 (2013.01); H01L 33/005 (2013.01); H01L 33/58 (2013.01); Y02P 70/521 (2015.11)

(58) Field of Classification Search
CPC ......... H01L 27/14625; H01L 27/14685; H01L 27/14687; H01L 24/13; H01L 24/11; H01L 31/18; H01L 31/02325; H01L 33/58; H01L 33/005
See application file for complete search history.

(56) References Cited

U.S. PATENT DOCUMENTS

2008/0094593 A1* 4/2008 Shibazaki ........... G03F 7/70725
355/53

FOREIGN PATENT DOCUMENTS

WO  WO 2016/013978  1/2016

* cited by examiner

*Primary Examiner* — (Vikki) Hoa B Trinh
(74) *Attorney, Agent, or Firm* — Fish & Richardson P.C.

(57) ABSTRACT

Optoelectronic modules for light emitting and/or light sensing include optical assemblies and active optoelectronic components. An optical assembly and a corresponding optoelectronic component can be aligned. The optoelectronic modules can include multiple optical assemblies and active optoelectronic components. Multiple optical assemblies and corresponding active optoelectronic components can be aligned independently of each other in various implementations of optoelectronic modules that include alignment features and optical assembly barrels.

19 Claims, 9 Drawing Sheets

OPTOELECTRONIC MODULES WITH OPTICS INTEGRATED INTO A CAP

TECHNICAL FIELD

This disclosure relates to an optoelectronic module with a cap with integrated optical components.

BACKGROUND

Optoelectronic modules include active optoelectronic elements such as light sensitive elements and light emitting elements. Typically, an active optoelectronic element is paired with a corresponding optical assembly. Further an active optoelectronic element and its corresponding optical assembly must be aligned. Optoelectronic modules may contain a plurality of optoelectronic elements and optical assemblies while maintaining small dimensions, e.g. a small footprint.

SUMMARY

This disclosure describes optoelectronic modules that permit the alignment of multiple active optoelectronic elements with their corresponding optical assemblies while maintaining a small footprint. In some implementations that include alignment features and optical assembly barrels, the optical assemblies and corresponding active optoelectronic components can be aligned independently of each other.

For example, in one aspect, an optoelectronic module includes a substrate on which are mounted a first active optoelectronic component and a second active optoelectronic component, each of which is configured to emit or detect light at a particular one or more wavelengths. A first optical assembly barrel including a first optical assembly is over the first active optoelectronic component. The first optical assembly barrel is laterally surrounded by a second optical barrel assembly.

In accordance with the first aspect, the second optical barrel assembly includes a second optical assembly over the second active optoelectronic component. The second optical assembly is surrounded laterally by sections of the second optical barrel assembly that are substantially non-transparent to the one or more wavelengths of light. A first alignment feature separates the first optical assembly barrel from the substrate. The first alignment feature establishes a first assembly dimension with respect to the first optical assembly independent of a second assembly dimension. A second alignment feature separates the second optical barrel assembly from the substrate. The second alignment feature establishes the second assembly dimension with respect to the second optical assembly.

In a second aspect, an optoelectronic module includes a substrate on which is mounted a first active optoelectronic component, a second active optoelectronic component, and a third active optoelectronic component each of which is configured to emit or detect light at a particular one or more wavelengths. A first optical assembly barrel including a first optical assembly is over the first active optoelectronic component. The first optical assembly barrel is laterally surrounded by a second optical barrel assembly. The second optical barrel assembly including a second optical assembly is over the second active optoelectronic component, and a third optical assembly is over the third active optoelectronic component. The second optical assembly and the third optical assembly are surrounded laterally by sections of the second optical barrel assembly that are substantially non-transparent to the one or more wavelengths of light.

In accordance with the second aspect, a second alignment feature separates the second optical barrel assembly from the substrate. The second alignment feature establishes a second assembly dimension with respect to the second optical assembly and a third assembly dimension with respect to the third optical assembly. A first alignment feature separates the first optical assembly barrel from the substrate. The first alignment feature establishes a first assembly dimension with respect to the first optical assembly independent of the second and third assembly dimensions.

A third aspect describes a method of manufacturing an optoelectronic module. The method includes applying a first optical beam to a second optical assembly laterally surrounded by sections of a second optical barrel assembly having a first alignment feature, and adjusting a height of the first alignment feature to attain a specified value for a first assembly dimension with respect to the second optical assembly. A second optical beam is applied to a first optical assembly integrated in a first optical assembly barrel. The method further includes adjusting a height of at least one feature of the first optical assembly or of the first optical assembly barrel to attain a specified value for a second assembly dimension with respect to the first optical assembly. The first optical assembly barrel, including the first optical assembly, is mounted over a first active optoelectronic component such that a surface of a second alignment feature of the first optical assembly barrel is in direct or indirect contact with a surface of the first active optoelectronic component. The method also includes mounting the second optical barrel assembly, including the second optical assembly, over a substrate on which the first active optoelectronic component is mounted such that a surface of the first alignment feature is in direct or indirect contact with a surface of the substrate.

A fourth aspect describes a method of positioning a first optical assembly within an optical barrel assembly having a through-hole therein and an edge surface to support the optical assembly. The method includes applying a probe beam while moving a test optical assembly within the through-hole and determining a position for the first optical assembly. A height of the edge surface is adjusted, and the first optical assembly is inserted into the optical barrel assembly such that the first optical assembly is supported by the edge surface.

Other aspects, features and advantages will be readily apparent from the following detailed description, the accompanying drawings, and the claims.

DETAILED DESCRIPTION

Figure 1:
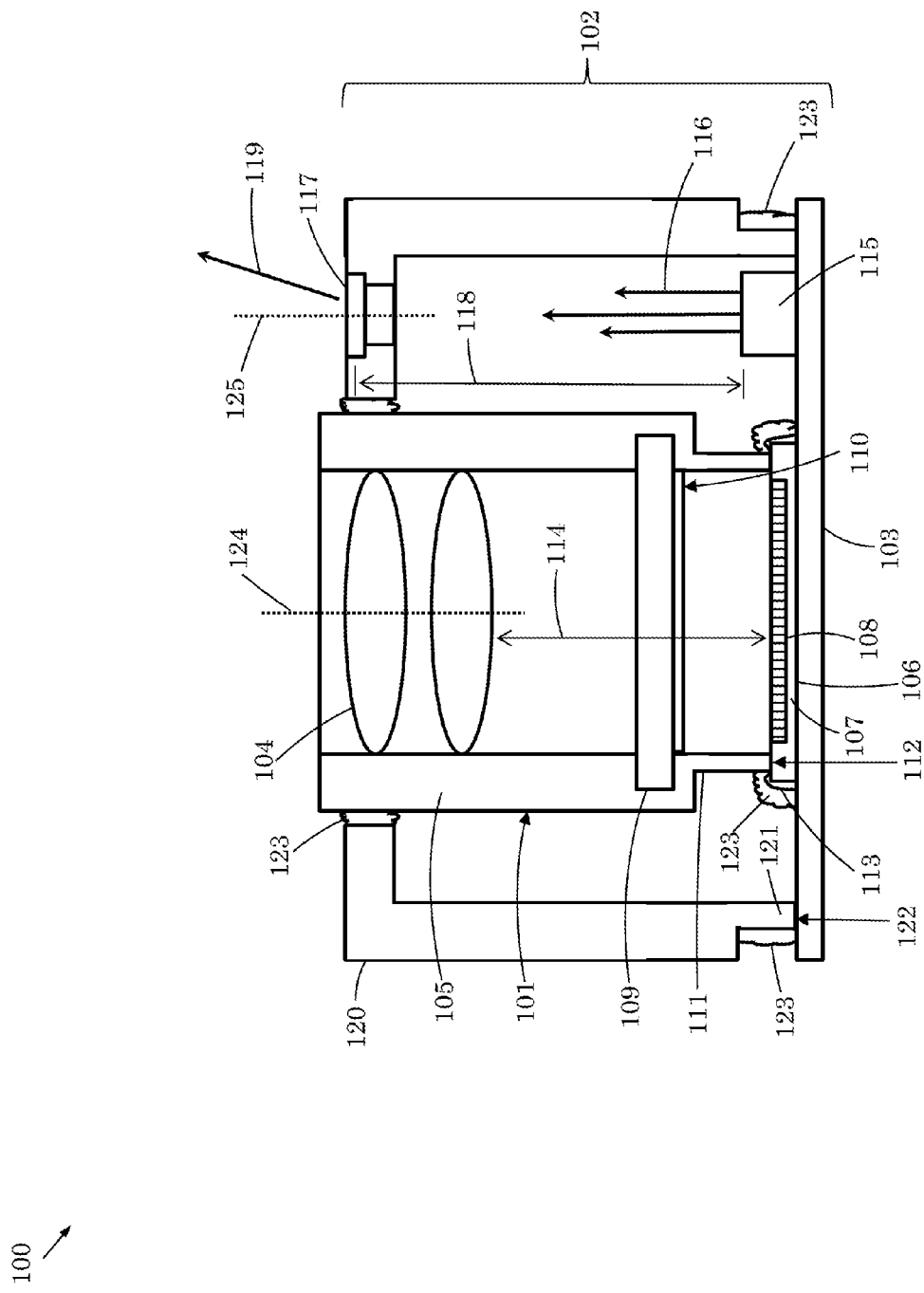
FIG. 1 depicts an example of an optoelectronic module with a detector assembly and an emitter assembly wherein an optical assembly is integrated into a cap.

FIG. 1 depicts an example of an optoelectronic module with a detector assembly and an emitter assembly wherein an optical assembly is integrated into a cap. An optoelectronic module 100 includes a detector assembly 101 and an emitter assembly 102, which are examples of a first active optoelectronic assembly and a second active optoelectronic assembly, respectively, mounted on an optoelectronic module substrate 103. The optoelectronic module substrate 103 may be, for example, a glass-reinforced resin, such as a printed circuit board (PCB). The detector assembly 101 is composed of a detector optical assembly 104, which is an example of a first optical assembly, mounted within a detector optical assembly barrel 105, which is an example of a first optical assembly barrel. The detector optical assembly 104 has a detector optical assembly axis 124, which is an example of a first assembly optical axis. The detector optical assembly barrel 105 may further include a component or components that enable actuation of the detector optical assembly 104 such as micro-electro-mechanical systems-based components and/or piezoelectric-based components. The detector assembly 101 further includes a sensor 106, which is an example of a first active optoelectronic component. The sensor 106 is composed of a sensor substrate 107 and an active sensor region 108 and may further include a color filter array (CFA) or another optical filter such as an IR cut filter.

In this example, the detector assembly 101 may be configured to collect images. Accordingly, the active sensor region 108 of sensor 106 may include a plurality of pixels. For example, the sensor 106 may be a complementary metal-oxide-semiconductor (CMOS) or charge-coupled device (CCD) sensor composed of an array of at least ten photo-sensitive pixels, but may be greater, e.g. may be hundreds, thousands, millions, or even a greater number of photo-sensitive pixels. Further the detector optical assembly 104 may be comprised of a plurality of optical components such as diffractive and/or refractive lenses, apertures, stops, optical filters, and/or active (e.g., transformable) diffractive and/or refractive lenses. The detector assembly 101 need not be configured to capture high-resolution images, however. For example, in some cases the detector assembly 101 may include a sensor 106 with an active sensor region 108 that is comprised of fewer than ten photo-sensitive pixels.

A transmissive panel 109 is disposed in between the detector optical assembly 104 and the sensor 106. The transmissive panel 109 may be mounted, for example, within the detector optical assembly barrel 105. The transmissive panel 109 may be composed of a material such as glass, sapphire, or other transmissive material that may have mechanical properties similar to glass and/or sapphire. In some instances the transmissive panel 109 may provide mechanical stability (e.g., it may prevent or minimize thermal expansion of the optoelectronic module 100). However, in other instances the transmissive panel 109 may not be required; that is, transmissive panel 109 may be omitted in other examples of optoelectronic modules. A transmissive layer 110 may be mounted on the transmissive panel 109. Typically, the transmissive layer 110 is mounted on the sensor side of the transmissive panel 109; however, the transmissive layer 110 may also be mounted on the detector optical assembly side of the transmissive panel 109 or the transmissive layer 110 may be mounted on both sides of the transmissive panel 109. The transmissive layers 110 may be an optical filter (such as dielectric optical filters). Alternatively, or in addition, the transmissive layer 110 on the transmissive panel 109 may be composed of a photosensitive material. The detector optical assembly 104 may in some instances have a focal length that is adjusted by removing material from the transmissive layer 110 such that the focal length is incident (i.e., in focus) on the active sensor region 108 of the sensor 106.

The detector assembly 101 further includes a detector alignment feature 111, which is an example of a first alignment feature, that extends from the detector optical assembly barrel 105. The detector alignment feature 111 includes a detector alignment feature surface 112, which is an example of a first alignment feature surface. The detector alignment feature surface 112 is in contact with the sensor substrate 107 on a region external to the active sensor region 108. The detector alignment feature surface 112 can be in direct contact with the sensor substrate 107 (i.e., without an intervening layer) or detector alignment feature surface 112 can be in indirect contact with sensor substrate 107 (i.e., with an intervening layer such as a thin layer of adhesive). Wires 113 may electrically connect the sensor 106 to the optoelectronic module substrate 103. The detector alignment feature 111 may have a shape and/or be located to accommodate the wires 113. For example, the detector alignment feature 111 may have the shape of a thin circumferential protrusion extending from the detector optical assembly barrel 105 toward the sensor 106 as depicted in FIG. 1. However, other shapes are possible; for example, detector alignment feature 111 may take the form of studs or columnar protrusions such as cylindrical, rectangular, and/or cubic protrusions. Dimensions of the detector alignment feature 111 may establish the magnitude of a detector assembly dimension 114, which is an example of a first assembly dimension, between the detector optical assembly 104 and the active sensor region 108. Further, in some cases, the detector alignment feature surface 112 can be in direct contact with the optoelectronic module substrate 103 (i.e., without an intervening layer) or detector alignment feature surface 112 can be in indirect contact with optoelectronic module substrate 103 (i.e., with an intervening layer such as a thin layer of adhesive).

The detector assembly dimension 114 may be considered in this example as the distance between the detector optical assembly 104 and the active sensor region 108. In this example, the detector assembly dimension 114 must correspond to a focal length of the detector optical assembly 104. That is, the focal length of the detector optical assembly 104 must be incident (i.e., in focus) on the active sensor region 108 of the sensor 106. However, variations in manufacturing of the detector optical assembly 104, and/or the detector optical assembly barrel 105, and/or the components that comprise the detector optical assembly barrel 105 such as the detector alignment feature 111 and the transmissive panel 109, may give rise to a variation in the detector assembly dimension 114 and/or the focal length of the detector optical assembly 104. Accordingly, the focal length may not correspond to the detector assembly dimension 114. To provide focal length adjustment, material may be removed from the detector alignment feature surface 112; for example, material may be machined, cut (e.g., mechanically), abraded, ground, and/or etched. Further material may be removed by laser cutting and/or micro-machining. Sufficient material may be removed from the detector alignment feature surface 112 such that the dimension of the detector alignment feature 111 permits the detector assembly dimension 114 to correspond to the focal length of the detector optical assembly 104.

The emitter assembly 102 of the optoelectronic module 100 is composed of an emitter 115, which is an example of a second active optoelectronic component, that produces emitted light 116. The emitter 115 may be a vertical-cavity surface-emitting laser (VCSEL), light emitting diode (LED), or other light emitting device. Emitted light 116 may be any wavelength or range of wavelengths of electromagnetic radiation (e.g., visible or non-visible radiation). For example, emitted light 116 may be near-, mid-, or far-infrared radiation. Further the emitted light 116 may be modulated in some cases. The emitted light 116 is incident on an emitter optical assembly 117. The emitter optical assembly 117 has an emitter optical assembly axis 125, which is an example of a second assembly optical axis. The emitter assembly 102 further includes a cap 120, which is an example of a second optical barrel assembly. An emitter assembly dimension 118, which is an example of a second assembly dimension, may be considered in this example as the distance between the emitter 115 and the emitter optical assembly 117, which is an example of a second optical assembly. The emitter optical assembly 117 may be any one of, or combinations of any one of, the following optical elements: a diffraction grating, a microlens array, a lens, a prism, a micro-prism array, a diffractive optical element or a plurality of anyone of the aforementioned or their respective combinations. The emitter optical assembly 117 may further be composed of apertures, spacers, alignment features, and other components pertinent to its function and apparent to one of ordinary skill in the art. The emitted light 116 incident on the emitter optical assembly 117 may produce an emission 119. The emission 119 may take the form of a pattern of high-contrast features, for example, a discrete array of illuminated dots, lines, or other shapes, or combinations of the aforementioned. The distance between the high-contrast features may be strongly correlated with the intended application of the optoelectronic module 100; generally, the distance between the features may be on the order of the dimension of the objects in the scene or smaller. Further the emission 119 may produce a homogenous (e.g., non-patterned/non-discrete illumination). The emitter optical assembly 117 is integrated into the cap 120. The cap 120 also includes an emitter alignment feature 121, which is an example of a second alignment feature, wherein an emitter alignment feature surface 122, which is an example of a second alignment feature surface, is in contact with the sensor-side surface of the optoelectronic module substrate 103. The emitter alignment feature 121 establishes the magnitude of the emitter assembly dimension 118.

The emitter assembly dimension 118 may be considered in this example as the distance between the emitter optical assembly 117 and the optoelectronic module substrate 103. In this example, the emitter assembly dimension 118 must correspond to a back focal length of the emitter optical assembly 117. However, variations in manufacturing of the emitter optical assembly 117 and the cap 120, for example, may give rise to a variation in the emitter assembly dimension 118 and/or the back focal length of the emitter optical assembly 117. Accordingly, the back focal length will not correspond to the emitter assembly dimension 118. To provide focal length adjustment, material may be removed from the emitter alignment feature surface 122; for example, material may be machined, cut, abraded, ground, and/or etched. Further material may be removed by laser cutting and/or micro-machining. Sufficient material may be removed from the emitter alignment feature surface 122 such that the dimension of the emitter alignment feature 121 permits the emitter assembly dimension 118 to correspond to the back focal length of the emitter optical assembly 117.

The emitter alignment feature surface 122 can be in direct contact with the optoelectronic module substrate 103 (i.e., without an intervening layer) or the emitter alignment feature surface 122 can be in indirect contact with the optoelectronic module substrate 103 (i.e., with an intervening layer such as a thin layer of adhesive). The emitter alignment feature 121 may have the shape of a thin circumferential protrusion extending from the cap 120 toward the sensor optoelectronic module substrate 103 depicted in FIG. 1. However, other shapes are possible; for example, the emitter alignment feature 121 may take the form of studs or columnar protrusions such as cylindrical, rectangular, and/or cubic protrusions.

The optoelectronic module 100 further includes adhesive 123. The adhesive 123 may be substantially non-transparent. For example, the adhesive may be non-transparent to wavelengths of light emitted by the emitter 115. Further the adhesive 123 may be non-transparent to wavelengths of light for which the sensor 106 is sensitive (e.g., if the sensor 106 is sensitive to a range of wavelengths encompassing infrared light, the adhesive 123 may be substantially non-transparent to those wavelengths of infrared light). The adhesive 123 may be in contact with the emitter alignment feature 121 and the optoelectronic module substrate 103 where the adhesive 123 may bond the optoelectronic module substrate 103 to the emitter alignment feature 121 and/or may provide a light-tight seal between the optoelectronic module substrate 103 and the emitter alignment feature 121. The adhesive 123 may be in contact with the cap 120 and the detector optical assembly barrel 105 where the adhesive 123 may bond the detector optical assembly barrel 105 to the cap 120 and/or may provide a light-tight seal between the detector optical assembly barrel 105 and the cap 120. The adhesive 123 may be in contact with the detector alignment feature 111 and the sensor substrate 107 where the adhesive 123 may bond the sensor substrate 107 to the detector alignment feature 111 and/or may provide a light-tight seal between the sensor substrate 107 and the detector alignment feature 111. Still further, in instances where the detector alignment feature 111 may take the form of studs, columnar protrusions, and/or other geometric protrusions, adhesive 123 may be located around the periphery of the sensor 106; that is, on the sensor substrate 107 outside of the active sensor region 108. In such instances, the adhesive 123 may function as a light-tight seal. Still further in instances where the emitter alignment feature 121 may take the form of studs, columnar protrusions, and/or other geometric protrusions, adhesive 123 may be located around the periphery of the optoelectronic module substrate 103. In such instances, the adhesive 123 may function as a light-tight seal.

Figure 2A:
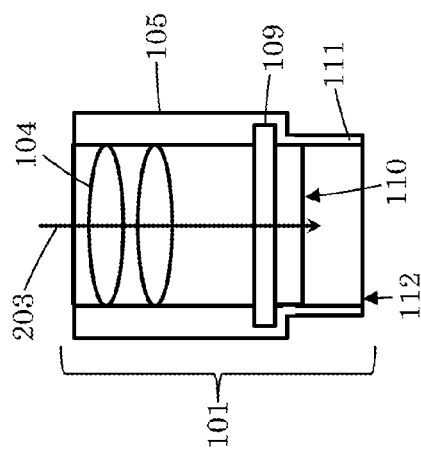
FIGS. 2A-2H depict a method of aligning the active optoelectronic components and optical assemblies of the example optoelectronic module depicted in FIG. 1.
Figure 2B:
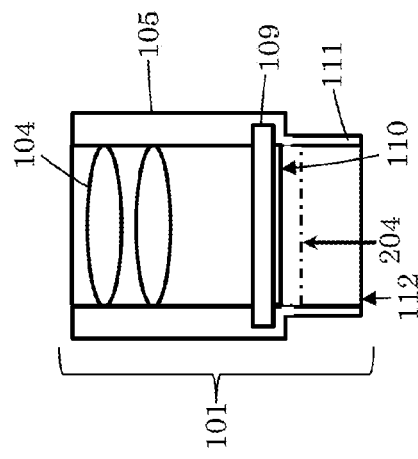

FIGS. 2A-2H depicts a method for aligning the active optoelectronic components and optical assemblies of the example optoelectronic module 100 depicted in FIG. 1. As illustrated in FIG. 2A, the emitter optical assembly 117, integrated within the cap 120, is located in the path of a first probing beam 201 wherein the first probing beam 201 is part of a testing apparatus (not shown). The first probing beam 201, in concert with the testing apparatus, may be used to determine the correct emitter assembly dimension 118. For example, the first probing beam 201 may determine the back focal length of the emitter optical assembly 117 wherein the back focal length gives the ideal emitter assembly dimension 118, a correction 202 may be applied to the emitter alignment feature 121 as illustrated in FIG. 2B. That is, material may be removed from the emitter alignment feature surface 122; for example, material may be machined, cut, abraded, ground, and/or etched. Further material may be removed by laser cutting and/or micro-machining. Sufficient material may be removed from the emitter alignment feature surface 122 such that the dimension of the emitter alignment feature 121 permits the emitter assembly dimension 118 to correspond to the back focal length of the emitter optical assembly 117.

Figure 2C:
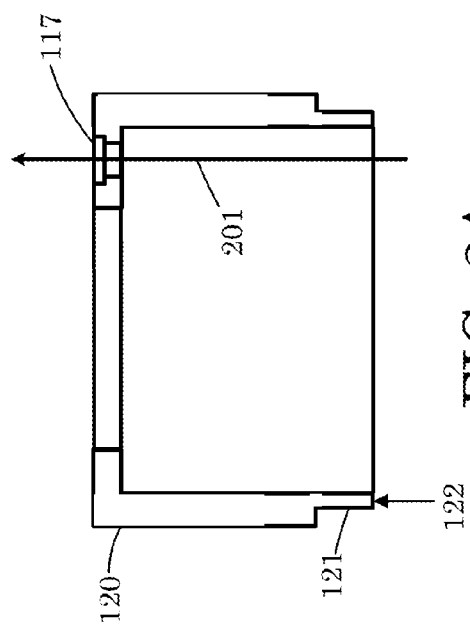
Figure 2D:
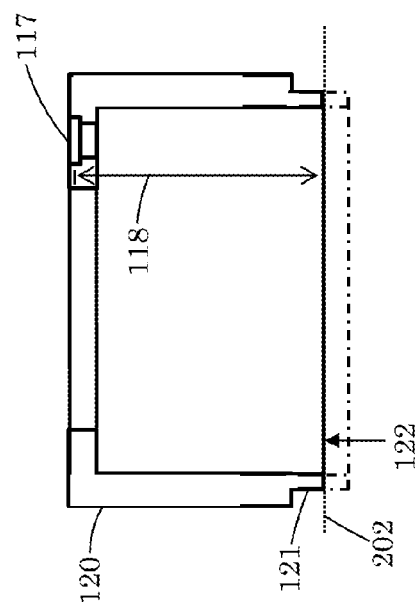

Further, as illustrated in FIG. 2C, the detector optical assembly 104 is located within the path of a second probing beam 203 wherein the second probing beam 203 is part of a testing apparatus (not shown). The second probing beam 203, in concert with the testing apparatus, determines the ideal detector assembly dimension 114. For example, the second probing beam 203 may determine the focal length of the detector optical assembly 104. Following the determination of the focal length of the detector optical assembly 104, the focal length may be modified by applying a correction 204 to the transmissive layer 110 as illustrated in FIG. 2D. For example, the transmissive layer 110 may be composed of a photosensitive material such as a photoresist. The transmissive layer 110 may be exposed to light and further developed such that the thickness of the transmissive layer 110 may be reduced such that the focal length of the detector optical assembly 104 is modified to a desired magnitude. The steps illustrated by FIG. 2C and FIG. 2D may be repeated until a desired focal length is achieved.

Figure 2E:
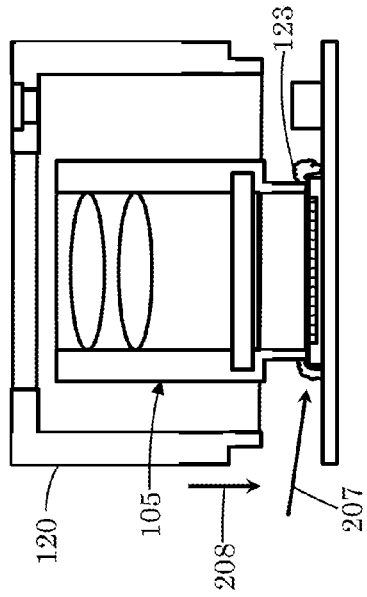

In addition to, or as an alternative to, the steps illustrated in FIG. 2C and FIG. 2D, the detector assembly dimension 114 may be altered to an optimum value. A correction 205 may be applied to the detector alignment feature 111 as illustrated in FIG. 2E; that is, material may be removed from the detector alignment feature surface 112 of the detector alignment feature 111. That is, material may be removed from the detector alignment feature surface 112; for example, material may be machined, cut, abraded, ground, and/or etched. Further material may be removed by laser cutting and/or micro-machining. Sufficient material may be removed from the detector alignment feature surface 112 such that the dimension of the detector alignment feature 111 permits the detector assembly dimension 114 to correspond to the focal length of the detector optical assembly 104.

Figure 2F:
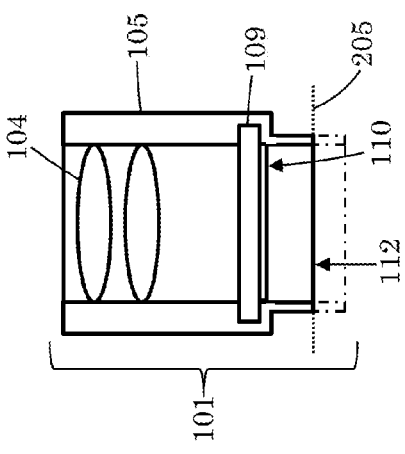
Figure 2G:
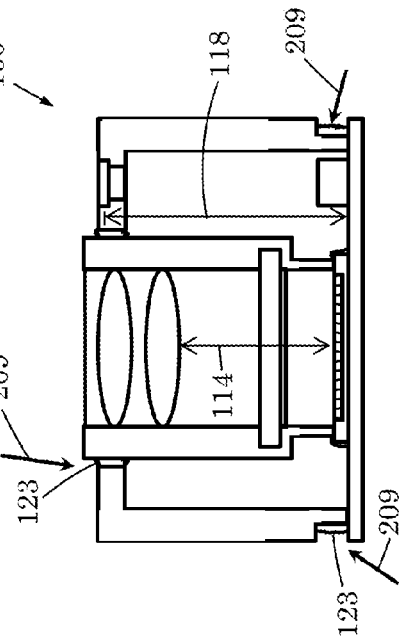
Figure 2H:
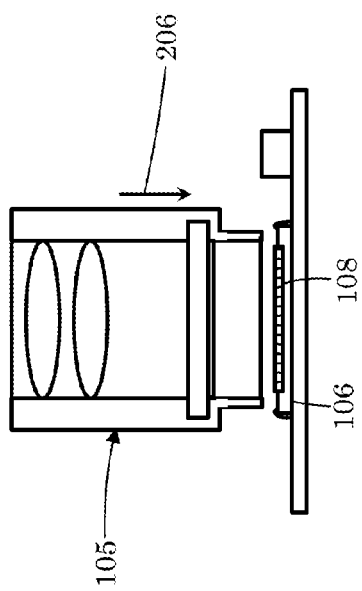

Following the above, the detector optical assembly barrel 105 must be mounted onto the sensor 106 as illustrated in FIG. 2F by the solid arrow 206. Further adhesive 123 may be injected as indicated by solid arrow 207 as illustrated in FIG. 2G between the detector alignment feature 111 and the sensor 106 and/or the optoelectronic module substrate 103. In a subsequent step, the cap 120 must be mounted onto the optoelectronic module substrate 103 as further illustrated in FIG. 2G by the solid arrow 208. Adhesive 123 may be injected as indicated by solid arrow 209 as illustrated in FIG. 2H between the detector optical assembly barrel 105 and the cap 120, and/or the emitter alignment feature 121 and the optoelectronic module substrate 103. The adhesive 123 may be cured by the application of heat and/or radiation (such as UV radiation) in a subsequent step (not shown).

Figure 3:
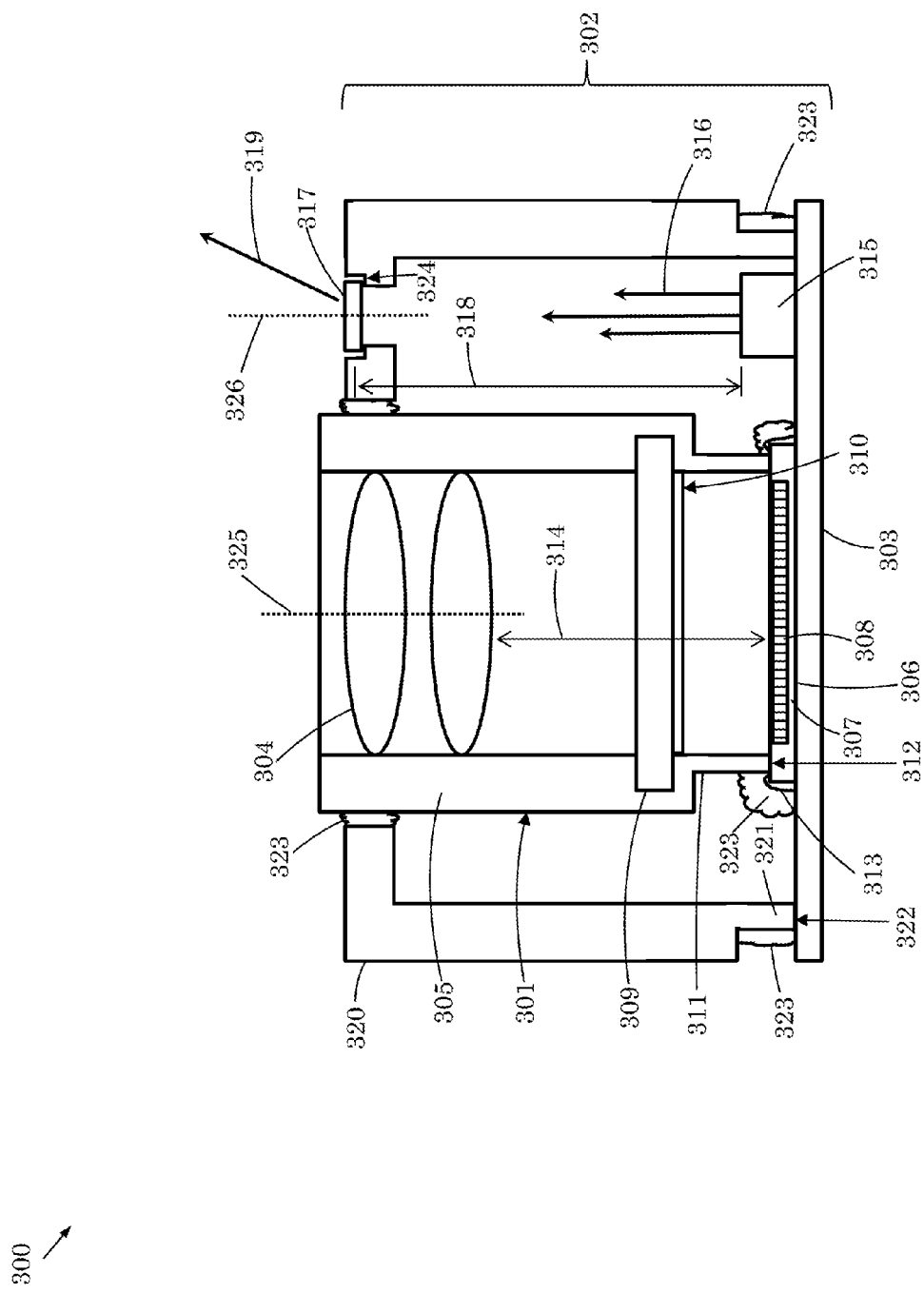
FIG. 3 depicts an example of an optoelectronic module with a detector assembly and an emitter assembly wherein an optical assembly is integrated into an alignment feature in a cap.

FIG. 3 depicts an example of an optoelectronic module with a detector assembly and an emitter assembly wherein an optical assembly is integrated into an alignment feature in a cap. An optoelectronic module 300 includes a detector assembly 301 and an emitter assembly 302, which are examples of a first active optoelectronic assembly and a second active optoelectronic assembly, respectively, mounted on an optoelectronic module substrate 303. The optoelectronic module substrate 303 may be, for example, a glass-reinforced resin, such as a printed circuit board (PCB). The detector assembly 301 is composed of a detector optical assembly 304, which is an example of a first optical assembly, mounted within a detector optical assembly barrel 305, which is an example of a first optical assembly barrel. The detector optical assembly 304 has a detector optical assembly axis 325, which is an example of a first assembly optical axis. The detector optical assembly barrel 305 may further include a component or components that enable actuation of the detector optical assembly 304 such as micro-electromechanical systems-based components and/or piezoelectric-based components. The detector assembly 301 further includes a sensor 306, which is an example of a first active optoelectronic component. The sensor 306 is composed of a sensor substrate 307 and an active sensor region 308 and may further include a color filter array (CFA) or another optical filter such as an IR cut filter.

In this example, the detector assembly 301 may be configured to collect images. Accordingly, the active sensor region 308 of sensor 306 may include a plurality of pixels. For example, the sensor 306 may be a CMOS or CCD sensor composed of an array of at least ten photo-sensitive pixels, but may be greater, e.g., may be hundreds, thousands, millions, or even a greater number of photo-sensitive pixels. Further the detector optical assembly 104 may be comprised of a plurality of optical components such as diffractive and/or refractive lenses, apertures, stops, optical filters, and/or active (e.g., transformable) diffractive and/or refractive lenses. The detector assembly 301 need not be configured to capture high-resolution images, however. For example, in some cases the detector assembly 301 may include a sensor 306 with an active sensor region 308 that is comprised of fewer than ten photo-sensitive pixels.

A transmissive panel 309 is disposed in between the detector optical assembly 304 and the sensor 306. The transmissive panel 309 may be mounted, for example, within the detector optical assembly barrel 305. The transmissive panel 309 may be composed of a material such as glass, sapphire, or other transmissive material that may have similar mechanical properties as glass and/or sapphire. In some instances the transmissive panel 309 may provide mechanical stability (e.g., it may prevent or minimize thermal expansion of the optoelectronic module 300). However, in other instances the transmissive panel 309 may not be required; that is, transmissive panel 309 may not be incorporated into other examples of optoelectronic modules. A transmissive layer 310 may be mounted on the transmissive panel 309. Typically, the transmissive layer 310 is mounted on the sensor side of the transmissive panel 309; however, the transmissive layer 310 may also be mounted on the detector optical assembly side of the transmissive panel 309 or the transmissive layer 310 may be mounted on both sides of the transmissive panel 309. The transmissive layer 310 may be an optical filter (such as dielectric optical filters). Alternatively or in addition the transmissive layer 310 on the transmissive panel 309 may be composed of a photosensitive material. The detector optical assembly 304 may in some instances have a focal length wherein the focal length may be adjusted by removing material from the transmissive layer 310 such that the focal length is incident (i.e., in focus) on the active sensor region 308 of the sensor 306.

The detector assembly 301 further includes a detector alignment feature 311, which is an example of a first alignment feature, that extends from the detector optical assembly barrel 305. The detector alignment feature 311 includes a detector alignment feature surface 312, which is an example of a first alignment feature surface. The detector alignment feature surface 312 is in contact with the sensor substrate 307 on a region external to the active sensor region 308. The detector alignment feature surface 312 may be in direct contact with the sensor substrate 307 (i.e., without an intervening layer) or detector alignment feature surface 312 may be in indirect contact with sensor substrate 307 (i.e., with an intervening layer such as a thin layer of adhesive). Wires 313 may electrically connect the sensor 306 to the optoelectronic module substrate 303. The detector alignment feature 311 may have a shape and/or be located to accommodate the wires 313. For example, the detector alignment feature 311 may have the shape of a thin circumferential protrusion extending from the detector optical assembly barrel 305 toward the sensor 306 as depicted in FIG. 3. However, other shapes are possible; for example, detector alignment feature 311 may take the form of studs or columnar protrusions such as cylindrical, rectangular, and/or cubic protrusions. Dimensions of the detector alignment feature 311 may establish the magnitude of a detector assembly dimension 314, which is an example of a first assembly dimension, between the detector optical assembly 304 and the active sensor region 308. Further, the detector alignment feature surface 312 may be in direct contact with the optoelectronic module substrate 303 (i.e., without an intervening layer) or detector alignment feature surface 312 may be in indirect contact with optoelectronic module substrate 303 (i.e., with an intervening layer such as a thin layer of adhesive).

The detector assembly dimension 314 may be considered in this example as the distance between the detector optical assembly 304 and the active sensor region 308. In this example, the detector assembly dimension 314 must correspond to a focal length of the detector optical assembly 304. That is, the focal length of the detector optical assembly 304 must be incident (i.e., in focus) on the active sensor region 308 of the sensor 306. However, variations in manufacturing of the detector optical assembly 304, and/or the detector optical assembly barrel 305, and/or the components that comprise the detector optical assembly barrel 305 such as the detector alignment feature 311 and the transmissive panel 309, may give rise to a variation in the detector assembly dimension 314 and/or the focal length of the detector optical assembly 304. Accordingly, the focal length may not correspond to the detector assembly dimension 314. Material may be removed from the detector alignment feature surface 312; for example, material may be machined, cut, abraded, ground, and/or etched. Further material may be removed by laser cutting and/or micro-machining. Sufficient material may be removed from the detector alignment feature surface 312 such that the dimension of the detector alignment feature 311 permits the detector assembly dimension 314 to correspond to the focal length of the detector optical assembly 304.

The emitter assembly 302 of the optoelectronic module 300 is composed of an emitter 315, which is an example of a second active optoelectronic component, that produces emitted light 316. The emitter 315 may be a vertical-cavity surface-emitting laser (VCSEL), light emitting diode (LED), or other light emitting device. Emitted light 316 may be any wavelength or range of wavelengths of electromagnetic radiation (e.g. visible or non-visible radiation). For example, emitted light 316 may be near-, mid-, or far-infrared radiation. Further the emitted light 316 may be modulated in some cases. The emitted light 316 is incident on an emitter optical assembly 317, which is an example of a second optical assembly. The emitter optical assembly 317 has an emitter optical assembly axis 326, which is an example of a second assembly optical axis. The emitter assembly 302 further includes a cap 320, which is a further example of a second optical barrel assembly. An emitter assembly dimension 318, which is an example of a second assembly dimension, may be considered in this example as the distance between the emitter 315 and the emitter optical assembly 317. The emitter optical assembly 317 may be any one of, or combinations of any one of, the following optical elements: a diffraction grating, a microlens array, a lens, a prism, a micro-prism array, a diffractive optical element or a plurality of anyone of the aforementioned or their respective combinations. The emitter optical assembly 317 may further be composed of apertures, spacers, alignment features, and other components pertinent to its function and apparent to one of ordinary skill in the art. The emitted light 316 incident on the emitter optical assembly 317 may produce an emission 319. The emission 319 may take the form of a pattern of high-contrast features, for example, a discrete array of illuminated dots, lines, or other shapes, or combinations of the aforementioned. The distance between the high-contrast features may be strongly correlated with the intended application of the optoelectronic module 300; generally, the distance between the features may be on the order of the dimension of the objects in the scene or smaller. Further the emission 319 may produce a homogenous (e.g., non-patterned/non-discrete illumination). The emitter optical assembly 317 is integrated into the cap 320. The cap 320 also includes an emitter alignment feature 321, which is an example of a second alignment feature, wherein an emitter alignment feature surface 322, which is an example of a second alignment feature surface, is in contact with the optoelectronic module substrate 303. The emitter alignment feature 321 establishes the magnitude of the emitter assembly dimension 318.

The emitter assembly dimension 318 may be considered in this example as the distance between the emitter optical assembly 317 and the optoelectronic module substrate 303. In this example, the emitter assembly dimension 318 must correspond to a back focal length of the emitter optical assembly 317. However, variations in manufacturing of the emitter optical assembly 317 and the cap 320, for example, may give rise to a variation in the emitter assembly dimension 318 and/or the back focal length of the emitter optical assembly 317. Accordingly, the back focal length will not correspond to the emitter assembly dimension 318. Material may be removed from the emitter alignment feature surface 322; for example, material may be machined, cut, abraded, ground, and/or etched. Further material may be removed by laser cutting and/or micro-machining. Sufficient material may be removed from the emitter alignment feature surface 322 such that the dimension of the emitter alignment feature 321 permits the emitter assembly dimension 318 to correspond to the back focal length of the emitter optical assembly 317.

The emitter alignment feature surface 322 may be in direct contact with the optoelectronic module substrate 303 (i.e., without an intervening layer) or the emitter alignment feature surface 322 may be in indirect contact with the optoelectronic module substrate 303 (i.e., with an intervening layer such as a thin layer of adhesive). The emitter alignment feature 321 may have the shape of a thin circumferential protrusion extending from the cap 320 toward the sensor optoelectronic module substrate 303 depicted in FIG. 3. However, other shapes are possible; for example, the emitter alignment feature 321 may take the form of studs or columnar protrusions such as cylindrical, rectangular, and/or cubic protrusions.

The optoelectronic module 300 further includes adhesive 323. The adhesive 323 may be substantially non-transparent. For example, the adhesive may be non-transparent to wavelengths of light emitted by the emitter 315. Further the adhesive 323 may be non-transparent to wavelengths of light for which the sensor 306 is sensitive (e.g., if the sensor 306 is sensitive to a range of wavelengths encompassing infrared light, the adhesive 323 may be substantially non-transparent to those wavelengths of infrared light). The adhesive 323 may be in contact with the emitter alignment feature 321 and the optoelectronic module substrate 303 where the adhesive 323 may bond the optoelectronic module substrate 303 to the emitter alignment feature 321 and/or may provide a light-tight seal between the optoelectronic module substrate 303 and the emitter alignment feature 321. The adhesive 323 may be in contact with the cap 320 and the detector optical assembly barrel 305 where the adhesive 323 may bond the detector optical assembly barrel 305 to the cap 320 and/or may provide a light-tight seal between the detector optical assembly barrel 305 and the cap 320. The adhesive 323 may be in contact with the detector alignment feature 311 and the sensor substrate 307 where the adhesive 323 may bond the sensor substrate 307 to the detector alignment feature 311 and/or may provide a light-tight seal between the sensor substrate 307 and the detector alignment feature 311.

The optoelectronic module 300 further includes an emitter optical assembly edge 324. The emitter optical assembly 317 may be mounted on/into the emitter optical assembly edge 324. Material may be removed from the emitter optical assembly edge 324; for example, material may be machined, cut, abraded, ground, and/or etched. Further material may be removed by laser cutting and/or micro-machining. Sufficient material may be removed from the emitter optical assembly edge 324 such that the emitter assembly dimension 318 corresponds with the back focal length of the emitter optical assembly 317. Moreover, adhesive 323 may be used to fix the emitter optical assembly 317 on/into the emitter optical assembly edge 324. Still further, in instances where the detector alignment feature 311 takes the form of studs, columnar protrusions, and/or other geometric protrusions, adhesive 323 may be located around the periphery of the sensor 306; that is, on the sensor substrate 307 outside of the active sensor region 308. In such instances, the adhesive 323 may function as a light-tight seal. Still further in instances where the emitter alignment feature 321 may take the form of studs, columnar protrusions, and/or other geometric protrusions, adhesive 323 may be located around the periphery of the optoelectronic module substrate 303. In such instances, the adhesive 323 may function as a light-tight seal.

Figure 4D:
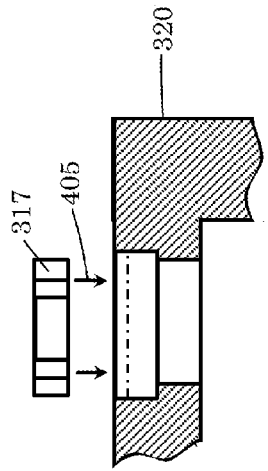
FIGS. 4A-4F depict a method of aligning multiple active optoelectronic elements with their corresponding optical assemblies within the same optoelectronic module wherein an optical assembly is integrated into an alignment feature in a cap.
Figure 4E:
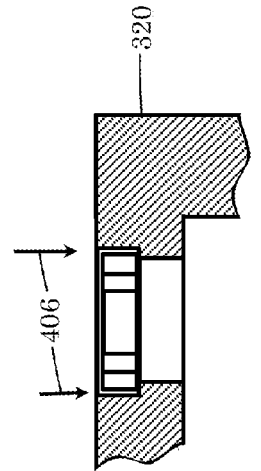
Figure 4F:
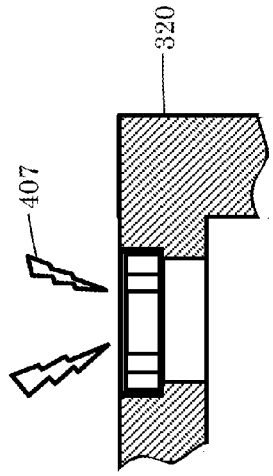
Figure 4A:
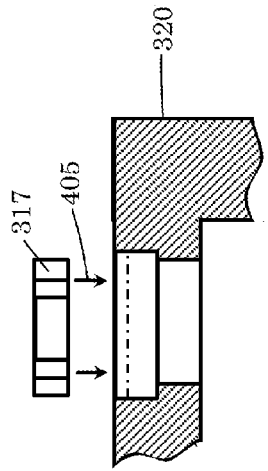
Figure 4B:
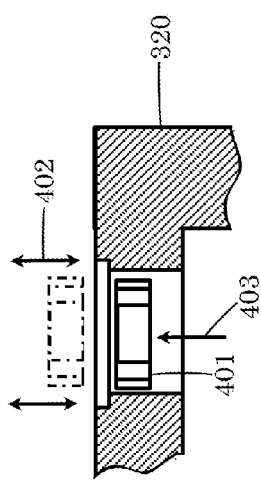

FIGS. 4A-4F depicts an example method 400 for positioning the emitter optical assembly 317 into the cap 320 of the optoelectronic module 300 as depicted in FIG. 3. As illustrated in FIG. 4A, a test optical assembly 401 may be located within the cap 320. The test optical assembly 401 may have similar optical properties as the emitter optical assembly 317; however, the test optical assembly 401 may move freely through the cap 320. The position of the test optical assembly 401 is altered as indicated by double-sides arrows 402 while a probing beam 403, part of a testing apparatus (not shown), is incident on the test optical assembly 401 as depicted in FIG. 4B. The probing beam 403, in concert with the testing apparatus, determines the correct position of the test optical assembly 401, for example, the position of the test optical assembly 401 where the back focal length equals the emitter assembly dimension 318.

Figure 4C:
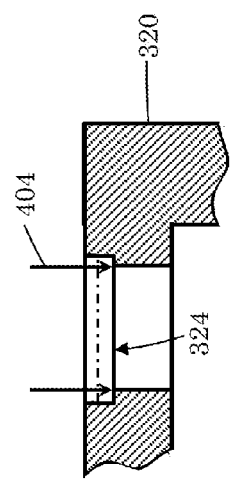

Material may be removed from the emitter optical assembly edge 324; for example, material may be machined, cut, abraded, ground, and/or etched. Further material may be removed by laser cutting and/or micro-machining. As illustrated in FIG. 4C, sufficient material may be removed, as illustrated by solid arrows 404, from the emitter optical assembly edge 324 such that the emitter assembly dimension 318 corresponds to the back focal length of the emitter optical assembly 317. The insertion of the emitter optical assembly 317 is illustrated in FIG. 4D by the solid arrows 405. The emitter optical assembly 317 is inserted into 320 and is in contact with the emitter optical assembly edge 324. Adhesive injection 406 around the periphery of the emitter optical assembly 317 is illustrated in FIG. 4E. The adhesive is then cured 407 as illustrated in FIG. 4F. The adhesive 123 may be cured by the application of heat and/or radiation (such as UV radiation) in a subsequent step (not shown).

Figure 5:
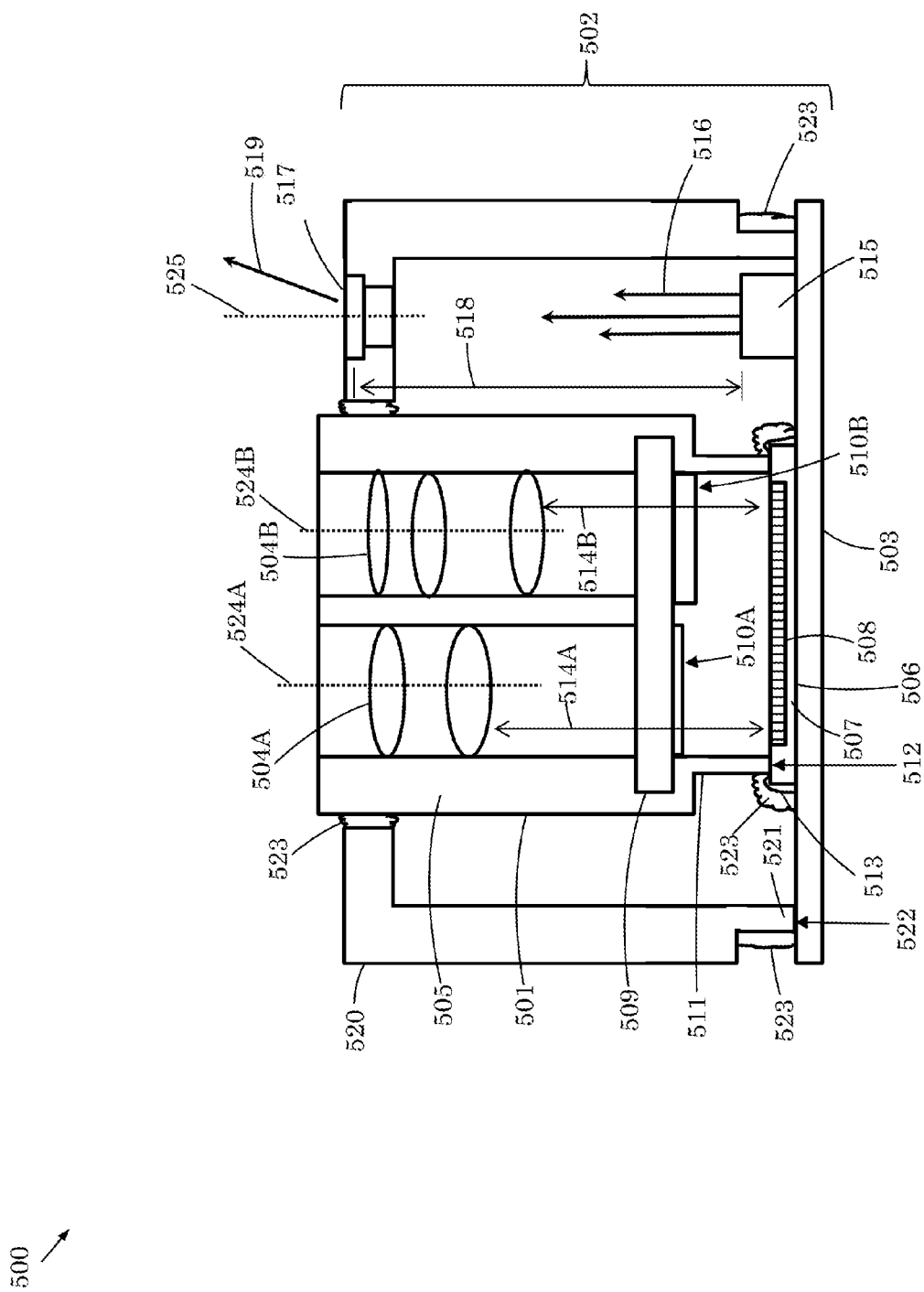
FIG. 5 depicts an example of an optoelectronic module with a plurality of optical channels and with a detector assembly and an emitter assembly wherein an optical assembly is integrated into a cap.

FIG. 5 depicts an example of an optoelectronic module 500, with a plurality of optical channels with a detector assembly and an emitter assembly wherein an optical assembly is integrated into a cap. The optoelectronic module 500 includes a detector assembly 501 and an emitter assembly 502, which are examples of a first active optoelectronic assembly and a second active optoelectronic assembly, respectively, mounted on an optoelectronic module substrate 503. The optoelectronic module substrate 503 may be, for example, a glass-reinforced resin, such as a printed circuit board (PCB). The detector assembly 501 is composed of a plurality of optical channels with a plurality of detector optical assemblies 504A, 504B, which are examples of first optical assemblies, mounted within a detector optical assembly barrel 505, which is an example of a first optical assembly barrel. The detector optical assemblies 504A, 504B have detector optical assembly axes 524A, 524B which are examples of first assembly optical axes. The detector optical assembly barrel 505 may further include a component or components that enable actuation of the detector optical assembly 504 such as micro-electro-mechanical systems-based components and/or piezoelectric-based components. The detector assembly 501 further includes a sensor 506, which is an example of a first active optoelectronic component. The sensor 506 is composed of a sensor substrate 507 and an active sensor region 508 and may further include a color filter array (CFA) or another optical filter such as an IR cut filter.

In this example, the detector assembly 501 may be configured to collect multiple images via the plurality of optical channels. Accordingly, the active sensor region 508 of sensor 506 may include a plurality of pixels. For example, the sensor 506 may be a CMOS or CCD sensor composed of an array of at least ten photo-sensitive pixels, but may have many more pixels, e.g., hundreds, thousands, millions, or even a greater number of photo-sensitive pixels. Further the detector optical assemblies 504A, 504B may each be comprised of a plurality of optical components such as diffractive and/or refractive lenses, apertures, stops, optical filters, and/or active (e.g., transformable) diffractive and/or refractive lenses. The detector assembly 501 need not be configured to capture high-resolution images, however. For example, in some cases the detector assembly 501 may include a sensor 506 with an active sensor region 508 that is comprised of fewer than ten photo-sensitive pixels.

A transmissive panel 509 is disposed in between the detector optical assemblies 504A, 504B and the sensor 506. The transmissive panel 509 may be mounted, for example, within the detector optical assembly barrel 505. The transmissive panel 509 may be composed of a material such as glass, sapphire, or other transmissive material that may have mechanical properties similar to glass and/or sapphire. In some instances the transmissive panel 509 may provide mechanical stability (e.g., it may prevent or minimize thermal expansion of the optoelectronic module 500). However, in other instances the transmissive panel 509 may not be required; that is, transmissive panel 509 may not be incorporated into other examples of optoelectronic modules. Transmissive layers 510A, 510B may be mounted on the transmissive panel 509. Typically, the transmissive layers 510A, 510B are mounted on the sensor side of the transmissive panel 509; however, the transmissive layers 510A, 510B may also be mounted on the detector optical assembly side of the transmissive panel 509 or the transmissive layers 510A, 510B may be mounted on both sides of the transmissive panel 509. The transmissive layers 510A, 510B may be optical filters (such as dielectric optical filters). Alternatively or in addition the transmissive layers 510A, 510B on the transmissive panel 509 may be composed of a photosensitive material. The detector optical assemblies 504A, 504B may in some instances have focal lengths wherein the focal lengths may be adjusted (i.e., independently of the other) by removing material from the transmissive layers 510A, 510B such that the focal lengths of the detector optical assemblies 504A, 504B are incident (i.e., in focus) on the active sensor region 508 of the sensor 506.

The detector assembly 501 further includes a detector alignment feature 511, which is an example of a first alignment feature, that extends from the detector optical assembly barrel 505. The detector alignment feature 511 includes a detector alignment feature surface 512, which is an example of a first alignment feature surface. The detector alignment feature surface 512 is in contact with the sensor substrate 507 on a region external to the active sensor region 508. The detector alignment feature surface 512 may be in direct contact with the sensor substrate 507 (i.e., without an intervening layer) or detector alignment feature surface 512 may be in indirect contact with sensor substrate 507 (i.e., with an intervening layer such as a thin layer of adhesive). Wires 513 may electrically connect the sensor 506 to the optoelectronic module substrate 503. The detector alignment feature 511 may have a shape and/or be located to accommodate the wires 113. For example, the detector alignment feature 511 may have the shape of a thin circumferential protrusion extending from the detector optical assembly barrel 505 toward the sensor 506 as depicted in FIG. 5. However, other shapes are possible; for example, detector alignment feature 511 may take the form of studs or columnar protrusions such as cylindrical, rectangular, and/or cubic protrusions. Dimensions of the detector alignment feature 511 may establish the magnitude of detector assembly dimensions 514A, 514B, which are examples of first assembly dimensions, between the detector optical assemblies 504A, 504B and the active sensor region 508. Further, the detector alignment feature surface 512 may be in direct contact with the optoelectronic module substrate 503 (i.e., without an intervening layer) or detector alignment feature surface 512 may be in indirect contact with optoelectronic module substrate 503 (i.e., with an intervening layer such as a thin layer of adhesive).

The detector assembly dimensions 514A, 514B may be considered in this example as the distance between the detector optical assemblies 504A, 504B and the active sensor region 508. In this example, the detector assembly dimensions 514A, 514B must correspond to a focal length of the detector optical assemblies 504A, 504B. That is, the focal length of the detector optical assemblies 504A, 504B must be incident (i.e., in focus) on the active sensor region 508 of the sensor 506. However, variations in manufacturing of the detector optical assemblies 504A, 504B, and/or the detector optical assembly barrel 505, and/or the components that comprise the detector optical assembly barrel 505 such as the detector alignment feature 511 and the transmissive panel 509, may give rise to a variation in the detector assembly dimensions 514A, 514B and/or the focal length of the detector optical assemblies 504A, 504B. Accordingly, the focal length may not correspond to the detector assembly dimensions 514A, 514B. To adjust the focal length, material may be removed from the detector alignment feature surface 512; for example, material may be machined, cut, abraded, ground, and/or etched. Further material may be removed by laser cutting and/or micro-machining. Sufficient material may be removed from the detector alignment feature surface 512 such that the dimension of the detector alignment feature 511 permits the detector assembly dimensions 514A, 514B to correspond to the focal length of their respective detector optical assemblies 504A, 504B.

The emitter assembly 502 of the optoelectronic module 500 is composed of an emitter 515, which is an example of a second active optoelectronic component, that produces emitted light 516. The emitter 515 may be a vertical-cavity surface-emitting laser (VCSEL), light emitting diode (LED), or other light emitting device. Emitted light 516 may be any wavelength or range of wavelengths of electromagnetic radiation e.g. visible or non-visible radiation. For example, emitted light 516 may be near-, mid-, or far-infrared radiation. Further the emitted light 516 may be modulated in some cases. The emitted light 516 is incident on an emitter optical assembly 517, which is an example of a second optical assembly. The emitter optical assembly 517 has an emitter optical assembly axis 525, which is an example of a second assembly optical axis. The emitter assembly 502 further includes a cap 520, which is a further example of a second optical barrel assembly. An emitter assembly dimension 518, which is an example of a second assembly dimension, may be considered in this example as the distance between the emitter 515 and the emitter optical assembly 517. The emitter optical assembly 517 may be any one of, or combinations of any one of, the following optical elements: a diffraction grating, a microlens array, a lens, a prism, a micro-prism array, a diffractive optical element or a plurality of anyone of the aforementioned or their respective combinations. The emitter optical assembly 517 may further be composed of apertures, spacers, alignment features, and other components pertinent to its function and apparent to one of ordinary skill in the art. The emitted light 516 incident on the emitter optical assembly 517 may produce an emission 519. The emission 519 may take the form of a pattern of high-contrast features, for example, a discrete array of illuminated dots, lines, or other shapes, or combinations of the aforementioned. The distance between the high-contrast features may be strongly correlated with the intended application of the optoelectronic module 500; generally, the distance between the features may be on the order of the dimension of the objects in the scene or smaller. Further the emission 519 may produce a homogenous (e.g., non-patterned/non-discrete illumination). The emitter optical assembly 517 is integrated into the cap 520. The cap 520 also includes an emitter alignment feature 521, which is an example of a second alignment feature, wherein an emitter alignment feature surface 522, which is an example of a second alignment feature surface, is in contact with the optoelectronic module substrate 503. The emitter alignment feature 521 establishes the magnitude of the emitter assembly dimension 518.

The emitter assembly dimension 518 may be considered in this example as the distance between the emitter optical assembly 517 and the optoelectronic module substrate 503. In this example, the emitter assembly dimension 518 must correspond to a back focal length of the emitter optical assembly 517. However, variations in manufacturing of the emitter optical assembly 517 and the cap 520, for example, may give rise to a variation in the emitter assembly dimension 518 and/or the focal length of the emitter optical assembly 517. Accordingly, the back focal length will not correspond to the emitter assembly dimension 518. Material may be removed from the emitter alignment feature surface 522; for example, material may be machined, cut, abraded, ground, and/or etched. Further material may be removed by laser cutting and/or micro-machining. Sufficient material may be removed from the emitter alignment feature surface 522 such that the dimension of the emitter alignment feature 521 permits the emitter assembly dimension 518 to correspond to the back focal length of the emitter optical assembly 517.

The emitter alignment feature surface 522 may be in direct contact with the optoelectronic module substrate 503 (i.e., without an intervening layer) or the emitter alignment feature surface 522 may be in indirect contact with the optoelectronic module substrate 503 (i.e., with an intervening layer such as a thin layer of adhesive). The emitter alignment feature 521 may have the shape of a thin circumferential protrusion extending from the cap 520 toward the sensor optoelectronic module substrate 503 depicted in FIG. 5. However, other shapes are possible; for example, the emitter alignment feature 521 may take the form of studs or columnar protrusions such as cylindrical, rectangular, and/or cubic protrusions.

The optoelectronic module 500 further includes adhesive 523. The adhesive 523 may be substantially non-transparent. For example, the adhesive may be non-transparent to wavelengths of light emitted by the emitter 515. Further the adhesive 523 may be non-transparent to wavelengths of light for which the sensor 506 is sensitive (e.g., if the sensor 506 is sensitive to a range of wavelengths encompassing infrared light, the adhesive 523 may be substantially non-transparent to those wavelengths of infrared light). The adhesive 523 may be in contact with the emitter alignment feature 521 and the optoelectronic module substrate 503 where the adhesive 523 may bond the optoelectronic module substrate 503 to the emitter alignment feature 521 and/or may provide a light-tight seal between the optoelectronic module substrate 503 and the emitter alignment feature 521. The adhesive 523 may be in contact with the cap 520 and the detector optical assembly barrel 505 where the adhesive 523 may bond the detector optical assembly barrel 505 to the cap 520 and/or may provide a light-tight seal between the detector optical assembly barrel 505 and the cap 520. The adhesive 523 may be in contact with the detector alignment feature 511 and the sensor substrate 507 where the adhesive 523 may bond the sensor substrate 507 to the detector alignment feature 511 and/or may provide a light-tight seal between the sensor substrate 507 and the detector alignment feature 511. Still further, in instances where 511 takes the form of studs, columnar protrusions, and/or other geometric protrusions adhesive 523 may be located around the periphery of the sensor 506; that is, on the sensor substrate 507 outside of the active sensor region 508. In such instances, the adhesive 523 may function as a light-tight seal. Still further in instances where the emitter alignment feature 521 may take the form of studs, columnar protrusions, and/or other geometric protrusions adhesive 523 may be located around the periphery of the optoelectronic module substrate 503. In such instances, the adhesive 523 may function as a light-tight seal.

Figure 6:
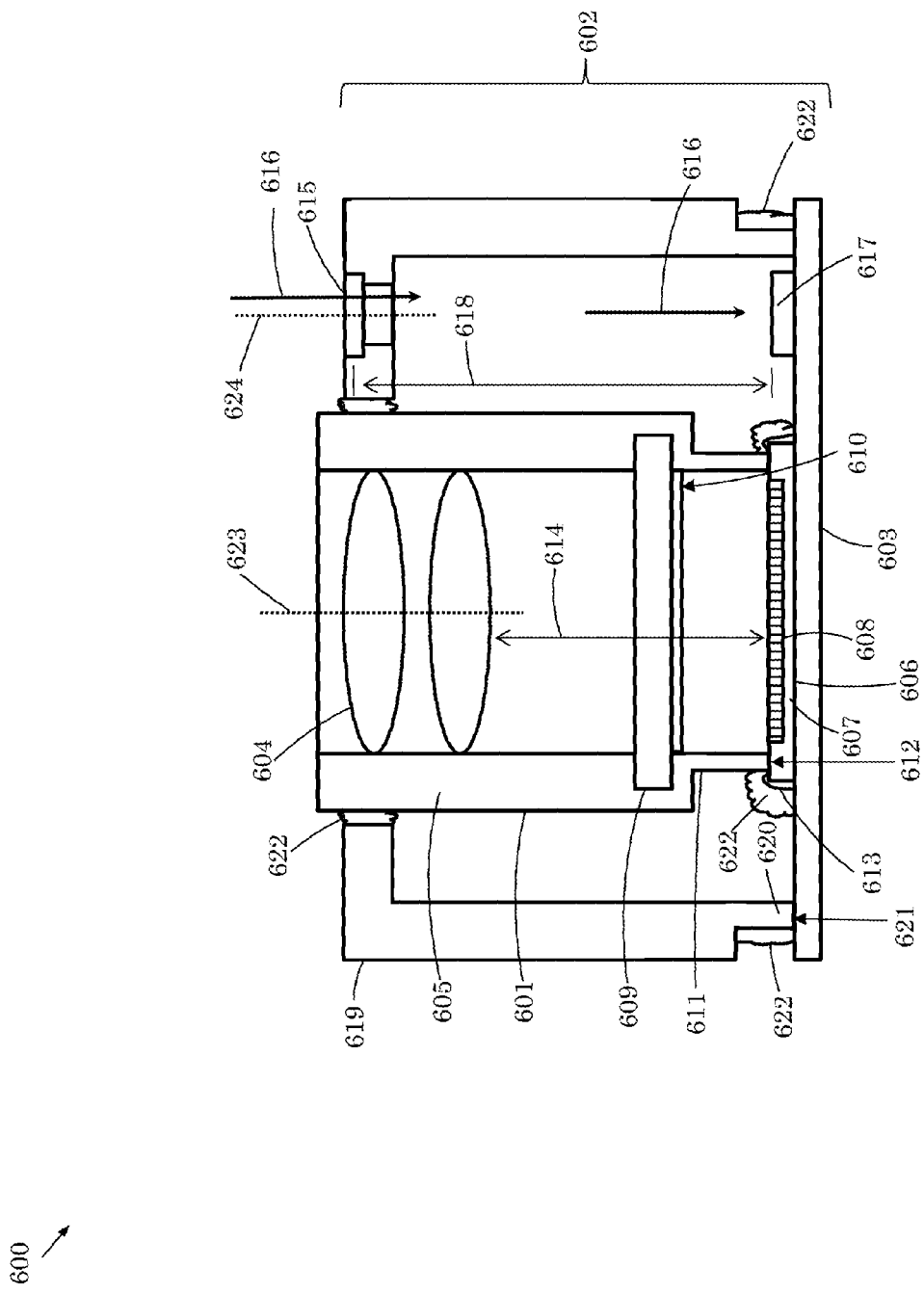
FIG. 6 depicts an example of an optoelectronic module with a detector assembly and an auxiliary detector assembly wherein an optical assembly is integrated into a cap.

FIG. 6 depicts an example of an optoelectronic module with a detector assembly and an auxiliary detector assembly wherein an optical assembly is integrated into a cap. An optoelectronic module 600 includes a detector assembly 601 and an auxiliary detector assembly 602, which are examples of a first active optoelectronic assembly and a second active optoelectronic assembly, respectively, mounted on an optoelectronic module substrate 603. The optoelectronic module substrate 603 may be, for example, a glass-reinforced resin, such as a printed circuit board (PCB). The detector assembly 601 is composed of a detector optical assembly 604, which is an example of a first optical assembly, mounted within a detector optical assembly barrel 605, which is an example of a first optical assembly barrel. The detector optical assembly 604 has a detector optical assembly axis 623, which is an example of a first assembly optical axis. The detector optical assembly barrel 605 may further include a component or components that enable actuation of the detector optical assembly 604 such as micro-electro-mechanical systems-based components and/or piezoelectric-based components. The detector assembly 601 further includes a sensor 606, which is an example of a first active optoelectronic component. The sensor 606 is composed of a sensor substrate 607 and an active sensor region 608 and may further include a color filter array (CFA) or another optical filter such as an IR cut filter.

In this example, the detector assembly 601 may be configured to collect images. Accordingly, the active sensor region 608 of sensor 606 may include a plurality of pixels. For example, the sensor 606 may be a CMOS or CCD sensor composed of an array of at least ten photo-sensitive pixels, but may have many more pixels, e.g., hundreds, thousands, millions, or even a greater number of photo-sensitive pixels. Further the detector optical assembly 604 may be comprised of a plurality of optical components such as diffractive and/or refractive lenses, apertures, stops, optical filters, and/or active (e.g., transformable) diffractive and/or refractive lenses. The detector assembly 601 need not be configured to capture high-resolution images, however. For example, in some cases the detector assembly 601 may include a sensor 606 with an active sensor region 108 that is comprised of fewer than then photo-sensitive pixels.

A transmissive panel 609 is disposed in between the detector optical assembly 604 and the sensor 606. The transmissive panel 609 may be mounted, for example, within the detector optical assembly barrel 605. The transmissive panel 609 may be composed of a material such as glass, sapphire, or other transmissive material that may have mechanical properties similar to glass and/or sapphire. In some instances the transmissive panel 609 may provide mechanical stability (e.g., it may prevent or minimize thermal expansion of the optoelectronic module 600). However, in other instances the transmissive panel 609 may not be required; that is, transmissive panel 609 may not be incorporated into other examples of optoelectronic modules. A transmissive layer 610 may be mounted on the transmissive panel 609. Typically, the transmissive layer 610 is mounted on the sensor side of the transmissive panel 609; however, the transmissive layer 610 may also be mounted on the detector optical assembly side of the transmissive panel 609 or the transmissive layer 610 may be mounted on both sides of the transmissive panel 609. The transmissive layers 610 may be an optical filter (such as dielectric optical filters). Alternatively or in addition the transmissive layer 610 on the transmissive panel 609 may be composed of a photosensitive material. The detector optical assembly 604 may in some instances have a focal length wherein the focal length may be adjusted by removing material from the transmissive layer 610 such that the focal length is incident (i.e., in focus) on the active sensor region 608 of the sensor 606.

The detector assembly 601 further includes a detector alignment feature 611, which is an example of a first alignment feature, that extends from the detector optical assembly barrel 605. The detector alignment feature 611 includes a detector alignment feature surface 612, which is an example of a first alignment feature surface. The detector alignment feature surface 612 is in contact with the sensor substrate 607 on a region external to the active sensor region 608. The detector alignment feature surface 612 may be in direct contact with the sensor substrate 607 (i.e., without an intervening layer) or detector alignment feature surface 612 may be in indirect contact with sensor substrate 607 (i.e., with an intervening layer such as a thin layer of adhesive). Wires 613 may electrically connect the sensor 606 to the optoelectronic module substrate 603. The detector alignment feature 611 may have a shape and/or be located to accommodate the wires 613. For example, the detector alignment feature 611 may have the shape of a thin circumferential protrusion extending from the detector optical assembly barrel 605 toward the sensor 606 as depicted in FIG. 6. However, other shapes are possible; for example, detector alignment feature 611 may take the form of studs or columnar protrusions such as cylindrical, rectangular, and/or cubic protrusions. Dimensions of the detector alignment feature 611 may establish the magnitude of a detector assembly dimension 614, which is an example of a first assembly dimension, between the detector optical assembly 604 and the active sensor region 608. Further, the detector alignment feature surface 612 may be in direct contact with the optoelectronic module substrate 603 (i.e., without an intervening layer) or detector alignment feature surface 612 may be in indirect contact with optoelectronic module substrate 603 (i.e., with an intervening layer such as a thin layer of adhesive).

The detector assembly dimension 614 may be considered in this example as the distance between the detector optical assembly 604 and the active sensor region 608. In this example, the detector assembly dimension 614 must correspond to a focal length of the detector optical assembly 604. That is, the focal length of the detector optical assembly 604 must be incident (i.e., in focus) on the active sensor region 608 of the sensor 606. However, variations in manufacturing of the detector optical assembly 604, and/or the detector optical assembly barrel 605, and/or the components that comprise the detector optical assembly barrel 605 such as the detector alignment feature 611 and the transmissive panel 609, may give rise to a variation in the detector assembly dimension 614 and/or the focal length of the detector optical assembly 604. Accordingly, the focal length may not correspond to the detector assembly dimension 614. Material may be removed from the detector alignment feature surface 612; for example, material may be machined, cut, abraded, ground, and/or etched. Further material may be removed by laser cutting and/or micro-machining. Sufficient material may be removed from the detector alignment feature surface 612 such that the dimension of the detector alignment feature 611 permits the detector assembly dimension 614 to correspond to the focal length of the detector optical assembly 604.

The auxiliary detector assembly 602 of the optoelectronic module 600 is composed of an auxiliary detector optical assembly 615, which is an example of a second optical assembly. The emitter optical assembly 615 has an emitter optical assembly axis 624, which is an example of a second assembly optical axis. The auxiliary detector assembly 602 further includes a cap 619, which is a further example of a second optical barrel assembly. Ambient light 616 may pass through the auxiliary detector optical assembly 615 and impinge an auxiliary detector sensor 617, which is an example of a second active optoelectronic component. The auxiliary detector sensor 617 may be sensitive any wavelength or range of wavelengths of electromagnetic radiation e.g. visible or non-visible radiation. For example, auxiliary detector assembly 602 is used to determine ambient light levels/ambient light composition. In another example, auxiliary detector assembly 602 may be configured to collect modulated light. Accordingly, auxiliary detector sensor 617 may be comprised of one or more demodulation pixels. An auxiliary detector assembly dimension may be considered in this example as the distance between the auxiliary detector optical assembly 615 and the auxiliary detector sensor 617. The auxiliary detector optical assembly 615 may be any one of, or combinations of any one of, the following optical elements: a diffraction grating, a microlens array, a lens, a prism, a micro-prism array, a diffractive optical element or a plurality of anyone of the aforementioned or their respective combinations. The auxiliary detector optical assembly 615 may further be composed of apertures, spacers, alignment features, and other components pertinent to its function and apparent to one of ordinary skill in the art. The auxiliary detector optical assembly 615 is integrated into the cap 619. The cap 619 also includes an auxiliary detector alignment feature 620, which is an example of a second alignment feature, wherein an auxiliary detector alignment feature surface 621, which is an example of a second alignment feature surface, is in contact with the optoelectronic module substrate 603. The auxiliary detector alignment feature 620 establishes the magnitude of an auxiliary detector assembly dimension 618, which is an example of a second assembly dimension.

The auxiliary detector assembly dimension 618 may be considered in this example as the distance between the auxiliary detector optical assembly 615 and the auxiliary detector sensor 617. In this example, the auxiliary detector assembly dimension 618 must correspond to a focal length of the auxiliary detector optical assembly 615. However, variations in manufacturing of the auxiliary detector optical assembly 615 and the cap 619, for example, may give rise to a variation in the auxiliary detector assembly dimension 618 and/or the focal length of the auxiliary detector optical assembly 615. Accordingly, the focal length may not correspond to the auxiliary detector assembly dimension 618. Material may be removed from the auxiliary detector alignment feature surface 621; for example, material may be machined, cut, abraded, ground, and/or etched. Further material may be removed by laser cutting and/or micromachining. Sufficient material may be removed from the auxiliary detector alignment feature surface 621 such that the dimension of the auxiliary detector alignment feature 620 permits the auxiliary detector assembly dimension 618 to correspond to the focal length of the auxiliary detector optical assembly 615.

The emitter alignment feature surface 621 may be in direct contact with the optoelectronic module substrate 603 (i.e., without an intervening layer) or the emitter alignment feature surface 621 may be in indirect contact with the optoelectronic module substrate 603 (i.e., with an intervening layer such as a thin layer of adhesive). The emitter alignment feature 620 may have the shape of a thin circumferential protrusion extending from the cap 619 toward the sensor optoelectronic module substrate 603 depicted in FIG. 6. However, other shapes are possible; for example, the emitter alignment feature 621 may take the form of studs or columnar protrusions such as cylindrical, rectangular, and/or cubic protrusions.

The optoelectronic module 600 further includes adhesive 622. The adhesive 622 may be substantially non-transparent. Further the adhesive 622 may be non-transparent to wavelengths of light for which the sensors 606 and/or the auxiliary detector sensor 617 are sensitive (e.g., if the sensor 606 is sensitive to a range of wavelengths encompassing infrared light, the adhesive 622 may be substantially non-transparent to those wavelengths of infrared light). The adhesive 622 may be in contact with the auxiliary detector alignment feature 620 and the optoelectronic module substrate 603 where the adhesive 622 may bond the optoelectronic module substrate 603 to the auxiliary detector alignment feature 620 and/or may provide a light-tight seal between the optoelectronic module substrate 603 and the auxiliary detector alignment feature 620. The adhesive 622 may be in contact with the cap 619 and the detector optical assembly barrel 605 where the adhesive 622 may bond the detector optical assembly barrel 605 to the cap 619 and/or may provide a light-tight seal between the detector optical assembly barrel 605 and the cap 619. The adhesive 622 may be in contact with the detector alignment feature 611 and the sensor substrate 607 where the adhesive 622 may bond the sensor substrate 607 to the detector alignment feature 611 and/or may provide a light-tight seal between the sensor substrate 607 and the detector alignment feature 611. Still further, in instances where 611 takes the form of studs, columnar protrusions, and/or other geometric protrusions adhesive 622 may be located around the periphery of the sensor 606; that is, on the sensor substrate 607 outside of the active sensor region 608. In such instances, the adhesive 622 may function as a light-tight seal. Still further in instances where the auxiliary detector alignment feature 620 may take the form of studs, columnar protrusions, and/or other geometric protrusions adhesive 622 may be located around the periphery of the optoelectronic module substrate 603. In such instances, the adhesive 622 may function as a light-tight seal.

Figure 7:
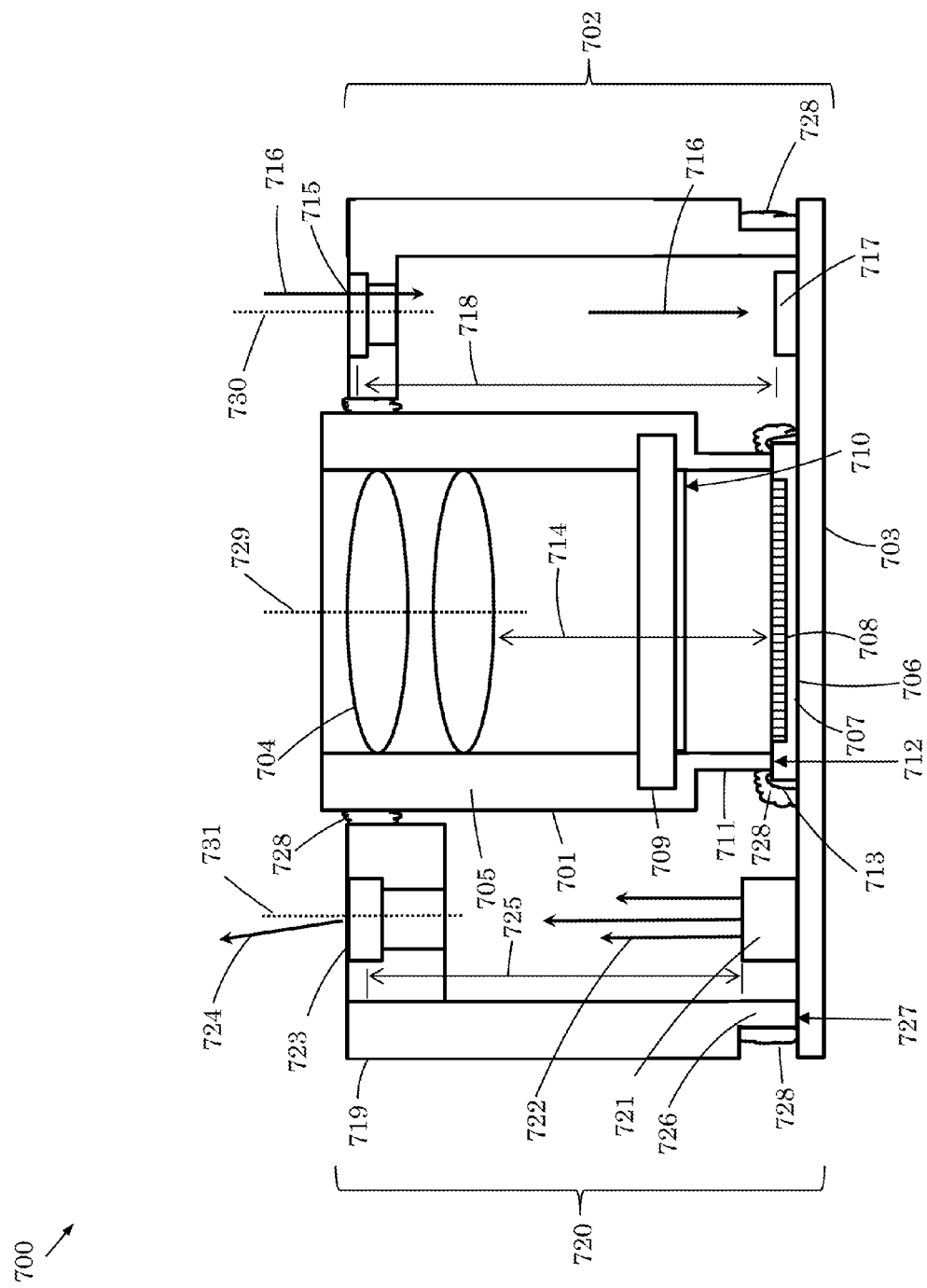
FIG. 7 depicts an example of an optoelectronic module with a detector assembly, an auxiliary detector assembly, and an emitter assembly wherein multiple optical assemblies are integrated into a cap.

FIG. 7 depicts an example of an optoelectronic module 700 with a detector assembly, an auxiliary detector assembly, and an emitter wherein multiple optical assemblies are integrated into a cap. The optoelectronic module 700 includes a detector assembly 701, which is an example of a first active optoelectronic assembly, an auxiliary detector 702, which is an example of a second active optoelectronic assembly, an emitter assembly 720, which is another example of a second active optoelectronic assembly, mounted on an optoelectronic module substrate 703. The optoelectronic module substrate 703 may be, for example, a glass-reinforced resin, such as a printed circuit board (PCB). The detector assembly 701 is composed of a detector optical assembly 704, which is an example of a first optical assembly, mounted within a detector optical assembly barrel 705, which is an example of a first optical assembly barrel. The detector optical assembly 704 has a detector optical assembly axis 729, which is an example of a first assembly optical axis The detector optical assembly barrel 705 may further include a component or components that enable actuation of the detector optical assembly 704 such as micro-electromechanical systems-based components and/or piezoelectric-based components. The detector assembly 701 further includes a sensor 706, which is an example of a first active optoelectronic component. The sensor 706 is composed of a sensor substrate 707 and an active sensor region 708 and may further include a color filter array (CFA) or another optical filter such as an IR cut filter.

In this example, the detector assembly 701 may be configured to collect images. Accordingly, the active sensor region 708 of sensor 706 may include a plurality of pixels. For example, the sensor 706 may be a CMOS or CCD sensor composed of an array of at least 10 photo-sensitive pixels, but may be greater, e.g. may be hundreds, thousands, millions, or even a greater number of photo-sensitive pixels. Further the detector optical assembly 704 may be comprised of a plurality of optical components such as diffractive and/or refractive lenses, apertures, stops, optical filters, and/or active (e.g., transformable) diffractive and/or refractive lenses. The detector assembly 701 need not be configured to capture high-resolution images, however. For example, in some cases the detector assembly 701 may include a sensor 706 with an active sensor region 708 that is comprised of less than 10 photo-sensitive pixels.

A transmissive panel 709 is disposed in between the detector optical assembly 704 and the sensor 706. The transmissive panel 709 may be mounted, for example, within the detector optical assembly barrel 705. The transmissive panel 709 may be composed of a material such as glass, sapphire, or other transmissive material that may have similar mechanical properties as glass and/or sapphire. In some instances the transmissive panel 709 may provide mechanical stability (e.g., it may prevent or minimize thermal expansion of the optoelectronic module 700). However, in other instances the transmissive panel 709 may not be required; that is, transmissive panel 709 may not be incorporated into other examples of optoelectronic modules. A transmissive layer 710 may be mounted on the transmissive panel 709. Typically, the transmissive layer 710 is mounted on the sensor side of the transmissive panel 709; however, the transmissive layer 710 may also be mounted on the detector optical assembly side of the transmissive panel 709 or the transmissive layer 710 may be mounted on both sides of the transmissive panel 709. The transmissive layers 710 may be an optical filter (such as dielectric optical filters). Alternatively or in addition the transmissive layer 710 on the transmissive panel 709 may be composed of a photosensitive material. The detector optical assembly 704 may in some instances have a focal length wherein the focal length may be adjusted by removing material from the transmissive layer 710 such that the focal length is incident (i.e. in focus) on the active sensor region 708 of the sensor 706.

The detector assembly 701 further includes a detector alignment feature 711, which is an example of a first alignment feature, that extends from the detector optical assembly barrel 705. The detector alignment feature 711 includes a detector alignment feature surface 712, which is an example of a first alignment feature surface. The detector alignment feature surface 712 is in contact with the sensor substrate 707 on a region external to the active sensor region 708. The detector alignment feature surface 712 may be in direct contact with the sensor substrate 707 (i.e., without an intervening layer) or detector alignment feature surface 712 may be in indirect contact with sensor substrate 707 (i.e., with an intervening layer such as a thin layer of adhesive). Wires 713 may electrically connect the sensor 706 to the optoelectronic module substrate 703. The detector alignment feature 711 may have a shape and/or be located to accommodate the wires 713. For example, the detector alignment feature 711 may have the shape of a thin circumferential protrusion extending from the detector optical assembly barrel 705 toward the sensor 706 as depicted in FIG. 7. However, other shapes are possible; for example, detector alignment feature 711 may take the form of studs or columnar protrusions such as cylindrical, rectangular, and/or cubic protrusions. Dimensions of the detector alignment feature 711 may establish the magnitude of a detector assembly dimension 714, which is an example of a first assembly dimension, between the detector optical assembly 704 and the active sensor region 708. Further, the detector alignment feature surface 712 may be in direct contact with the optoelectronic module substrate 703 (i.e., without an intervening layer) or detector alignment feature surface 712 may be in indirect contact with optoelectronic module substrate 703 (i.e., with an intervening layer such as a thin layer of adhesive).

The detector assembly dimension 714 may be considered in this example as the distance between the detector optical assembly 704 and the active sensor region 708. In this example, the detector assembly dimension 714 must correspond to a focal length of the detector optical assembly 704. That is, the focal length of the detector optical assembly 704 must be incident (i.e., in focus) on the active sensor region 708 of the sensor 706. However, variations in manufacturing of the detector optical assembly 704, and/or the detector optical assembly barrel 705, and/or the components that comprise the detector optical assembly barrel 705 such as the detector alignment feature 711 and the transmissive panel 709, may give rise to a variation in the detector assembly dimension 714 and/or the focal length of the detector optical assembly 704. Accordingly, the focal length may not correspond to the detector assembly dimension 714. Material may be removed from the detector alignment feature surface 712; for example, material may be machined, cut, abraded, ground, and/or etched. Further material may be removed by laser cutting and/or micro-machining. Sufficient material may be removed from the detector alignment feature surface 712 such that the dimension of the detector alignment feature 711 permits the detector assembly dimension 714 to correspond to the focal length of the detector optical assembly 704.

The auxiliary detector assembly 702 of the optoelectronic module 700 is composed of an auxiliary detector optical assembly 715, which is an example of a second optical assembly. The emitter optical assembly 715 has an emitter optical assembly axis 730, which is an example of a second assembly optical axis. The auxiliary detector, emitter assembly 702 further includes a cap 719, which is a further example of a second optical barrel assembly. Ambient light 716 may pass through the auxiliary detector optical assembly 715 and impinge an auxiliary detector sensor 717, which is an example of a second active optoelectronic component. The auxiliary detector sensor 717 may be sensitive any wavelength or range of wavelengths of electromagnetic radiation e.g. visible or non-visible radiation. For example, auxiliary detector assembly 702 may be used to determine ambient light levels/ambient light composition. In another example, auxiliary detector assembly 702 may be configured to collect modulated light. Accordingly, auxiliary detector sensor 717 may be comprised of one or more demodulation pixels. An auxiliary detector assembly dimension 718, which is an example of a second assembly dimension, may be considered in this example as the distance between the auxiliary detector optical assembly 715 and the auxiliary detector sensor 717. The auxiliary detector optical assembly 715 may be any one of, or combinations of any one of, the following optical elements: a diffraction grating, a microlens array, a lens, a prism, a micro-prism array, a diffractive optical element or a plurality of anyone of the aforementioned or their respective combinations. The auxiliary detector optical assembly 715 may further be composed of apertures, spacers, alignment features, and other components pertinent to its function and apparent to one of ordinary skill in the art. The auxiliary detector, emitter assembly 702 further includes the cap 719. The auxiliary detector optical assembly 715 is integrated into the cap 719.

The emitter assembly 720 of the optoelectronic module 700 is composed of an emitter 721, which is an example of a third active optoelectronic component. The emitter 721 produces emitted light 722. The emitter 721 may be a vertical-cavity surface-emitting laser (VCSEL), light emitting diode (LED), or other light emitting device. Emitted light 722 may be any wavelength or range of wavelengths of electromagnetic radiation e.g. visible or non-visible radiation. For example, emitted light 722 may be near-, mid-, or far-infrared radiation. Further the emitted light 722 may be modulated in some cases. The emitted light 722 is incident on an emitter optical assembly 723, which is another example of a second optical assembly. The emitter optical assembly 723 has an emitter optical assembly axis 731, which is an example of a third assembly optical axis. An emitter assembly dimension 725, which is an example of a third assembly dimension, may be considered in this example as the distance between the emitter 722 and the emitter optical assembly 723. The emitter optical assembly 723 may be any one of, or combinations of any one of, the following optical elements: a diffraction grating, a microlens array, a lens, a prism, a micro-prism array, a diffractive optical element or a plurality of anyone of the aforementioned or their respective combinations. The emitter optical assembly 723 may further be composed of apertures, spacers, alignment features, and other components pertinent to its function and apparent to one of ordinary skill in the art. The emitted light 725 incident on the emitter optical assembly 723 may produce an emission 724. The emission 724 may take the form of a pattern of high-contrast features, for example, a discrete array of illuminated dots, lines, or other shapes, or combinations of the aforementioned. The distance between the high-contrast features may be strongly correlated with the intended application of the optoelectronic module 700; generally, the distance between the features may be on the order of the dimension of the objects in the scene or smaller. Further the emission 724 may produce a homogenous (e.g. non-patterned/non-discrete illumination). The emitter optical assembly 723 is integrated into a cap 719. The cap 719 also includes an auxiliary detector, emitter alignment feature 726, which is an example of a second alignment feature, wherein an auxiliary detector, emitter alignment feature surface 727, which is an example of a second alignment feature surface, is in contact with the optoelectronic module substrate 703. The auxiliary detector, emitter alignment feature 726 establishes the magnitude of the emitter assembly dimension 725.

The emitter assembly dimension 725 may be considered in this example as the distance between the emitter optical assembly 723 and the optoelectronic module substrate 703. In this example, the emitter assembly dimension 725 must correspond to a back focal length of the emitter optical assembly 723. However, variations in manufacturing of the emitter optical assembly 723 and the cap 719, for example, may give rise to a variation in the emitter assembly dimension 725 and/or the back focal length of the emitter optical assembly 723. Accordingly, the back focal length will not correspond to the emitter assembly dimension 725. Material may be removed from the auxiliary detector, emitter alignment feature surface 727; for example, material may be machined, cut, abraded, ground, and/or etched. Further material may be removed by laser cutting and/or micro-machining. Sufficient material may be removed from the auxiliary detector, emitter alignment feature surface 727 such that the dimension of the auxiliary detector, emitter alignment feature 726 permits the emitter assembly dimension 725 to correspond to the back focal length of the emitter optical assembly 723.

The auxiliary detector, emitter alignment feature surface 727 may be in direct contact with the optoelectronic module substrate 703 (i.e., without an intervening layer) or the auxiliary detector, emitter alignment feature surface 727 may be in indirect contact with the optoelectronic module substrate 703 (i.e., with an intervening layer such as a thin layer of adhesive). The auxiliary detector, emitter alignment feature 726 may have the shape of a thin circumferential protrusion extending from the cap 719 toward the sensor optoelectronic module substrate 703 depicted in FIG. 7. However, other shapes are possible; for example, the auxiliary detector, emitter alignment feature 726 may take the form of studs or columnar protrusions such as cylindrical, rectangular, and/or cubic protrusions.

The optoelectronic module 700 further includes adhesive 728. The adhesive 728 may be substantially non-transparent. For example, the adhesive may be non-transparent to wavelengths of light emitted by the emitter 721. Further the adhesive 728 may be non-transparent to wavelengths of light for which the sensor 706 and/or the auxiliary detector sensor 717 are sensitive (e.g., if the sensor 706 is sensitive to a range of wavelengths encompassing infrared light, the adhesive 728 may be substantially non-transparent to those wavelengths of infrared light). The adhesive 728 may be in contact with the auxiliary detector, emitter alignment feature 726 and the optoelectronic module substrate 703 where the adhesive 728 may bond the optoelectronic module substrate 703 to the auxiliary detector, emitter alignment feature 726 and/or may provide a light-tight seal between the optoelectronic module substrate 703 and the auxiliary detector, emitter alignment feature 726. The adhesive 728 may be in contact with the cap 719 and the detector optical assembly barrel 705 where the adhesive 728 may bond the detector optical assembly barrel 705 to the cap 720 and/or may provide a light-tight seal between the detector optical assembly barrel 705 and the cap 719. The adhesive 728 may be in contact with the detector alignment feature 711 and the sensor substrate 707 where the adhesive 728 may bond the sensor substrate 707 to the detector alignment feature 711 and/or may provide a light-tight seal between the sensor substrate 707 and the detector alignment feature 711. Still further, in instances where 711 takes the form of studs, columnar protrusions, and/or other geometric protrusions adhesive 728 may be located around the periphery of the sensor 706; that is, on the sensor substrate 707 outside of the active sensor region 708. In such instances, the adhesive 728 may function as a light-tight seal. Still further in instances where the auxiliary detector, emitter alignment feature 726 may take the form of studs, columnar protrusions, and/or other geometric protrusions adhesive 728 may be located around the periphery of the optoelectronic module substrate 703. In such instances, the adhesive 728 may function as a light-tight seal.

Figure 8:
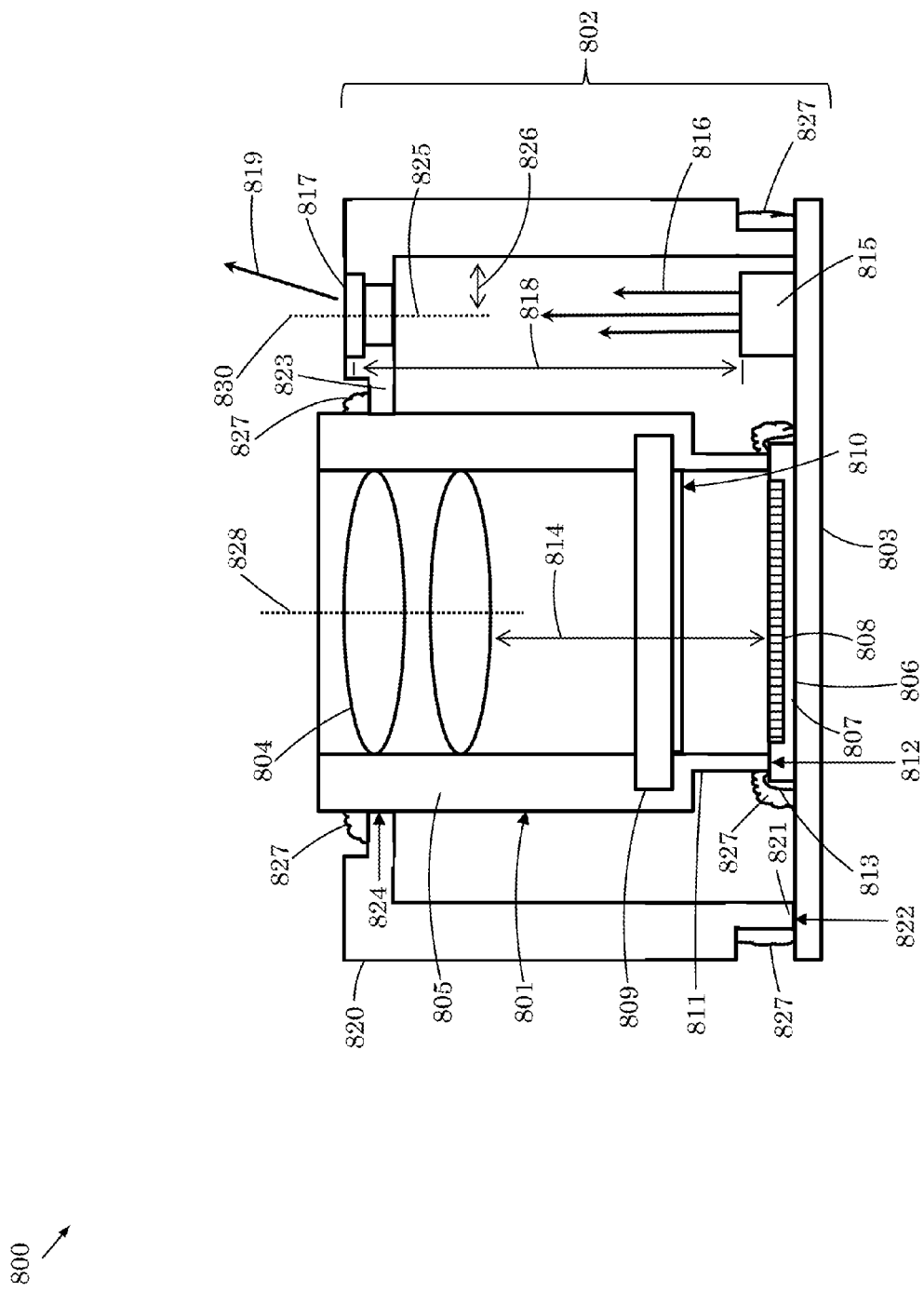
FIG. 8 depicts another example of an optoelectronic module with a detector assembly and an emitter assembly wherein an optical assembly is integrated into a cap.

FIG. 8 depicts another example of an optoelectronic module with a detector assembly and an emitter assembly wherein an optical assembly is integrated into a cap. An optoelectronic module 800 includes a detector assembly 801 and an emitter assembly 802, which are examples of first active optoelectronic assemblies and second active optoelectronic assemblies, respectively, mounted on an optoelectronic module substrate 803. The optoelectronic module substrate 803 may be, for example, a glass-reinforced resin, such as a printed circuit board (PCB). The detector assembly 801 is composed of a detector optical assembly 804, which is an example of a first optical assembly, mounted within a detector optical assembly barrel 805, which is an example of a first optical assembly barrel. The detector optical assembly 804 has a detector optical assembly axis 828, which is an example of a first assembly optical axis. The detector optical assembly barrel 805 may further include a component or components that enable actuation of the detector optical assembly 804 such as micro-electro-mechanical systems-based components and/or piezoelectric-based components. The detector assembly 801 further includes a sensor 806, which is an example of a first active optoelectronic component. The sensor 806 is composed of a sensor substrate 807 and an active sensor region 808 and may further include a color filter array (CFA) or another optical filter such as an IR cut filter (not shown).

In this example, the detector assembly 801 may be configured to collect images. Accordingly, the active sensor region 808 of sensor 806 may include a plurality of pixels. For example, the sensor 806 may be a CMOS or CCD sensor composed of an array of at least ten photo-sensitive pixels, but may have many more pixels, e.g., hundreds, thousands, millions, or even a greater number of photo-sensitive pixels. Further the detector optical assembly 804 may be comprised of a plurality of optical components such as diffractive and/or refractive lenses, apertures, stops, optical filters, and/or active (e.g., transformable) diffractive and/or refractive lenses. The detector assembly 801 need not be configured to capture high-resolution images, however. For example, in some cases the detector assembly 801 may include a sensor 806 with an active sensor region 808 that is comprised of fewer than ten photo-sensitive pixels.

A transmissive panel 809 is disposed in between the detector optical assembly 804 and the sensor 806. The transmissive panel 809 may be mounted, for example, within the detector optical assembly barrel 805. The transmissive panel 809 may be composed of a material such as glass, sapphire, or other transmissive material that may have similar mechanical properties as glass and/or sapphire. In some instances the transmissive panel 809 may provide mechanical stability (e.g., it may prevent or minimize thermal expansion of the optoelectronic module 800). However, in other instances the transmissive panel 809 may not be required; that is, transmissive panel 809 may not be incorporated into other examples of optoelectronic modules. A transmissive layer 810 may be mounted on the transmissive panel 809. Typically, the transmissive layer 810 is mounted on the sensor side of the transmissive panel 809; however, the transmissive layer 810 may also be mounted on the detector optical assembly side of the transmissive panel 809 or the transmissive layer 810 may be mounted on both sides of the transmissive panel 809. The transmissive layers 810 may be an optical filter (such as dielectric optical filters). Alternatively or in addition the transmissive layer 810 on the transmissive panel 809 may be composed of a photosensitive material. The detector optical assembly 804 may in some instances have a focal length wherein the focal length may be adjusted by removing material from the transmissive layer 810 such that the focal length is incident (i.e., in focus) on the active sensor region 808 of the sensor 806.

The detector assembly 801 further includes a detector alignment feature 811, which is an example of a first alignment feature, that extends from the detector optical assembly barrel 805. The detector alignment feature 811 includes a detector alignment feature surface 812, which is an example of a first alignment feature surface. The detector alignment feature surface 812 is in contact with the sensor substrate 807 on a region external to the active sensor region 808. The detector alignment feature surface 812 may be in direct contact with the sensor substrate 807 (i.e., without an intervening layer) or detector alignment feature surface 812 may be in indirect contact with sensor substrate 807 (i.e., with an intervening layer such as a thin layer of adhesive). Wires 813 may electrically connect the sensor 806 to the optoelectronic module substrate 803. The detector alignment feature 811 may have a shape and/or be located to accommodate the wires 813. For example, the detector alignment feature 811 may have the shape of a thin circumferential protrusion extending from the detector optical assembly barrel 805 toward the sensor 806 as depicted in FIG. 8. However, other shapes are possible; for example, detector alignment feature 811 may take the form of studs or columnar protrusions such as cylindrical, rectangular, and/or cubic protrusions. Dimensions of the detector alignment feature 811 may establish the magnitude of a detector assembly dimension 814, which is an example of a first assembly dimension, between the detector optical assembly 804 and the active sensor region 808. Further, the detector alignment feature surface 812 may be in direct contact with the optoelectronic module substrate 803 (i.e., without an intervening layer) or detector alignment feature surface 812 may be in indirect contact with optoelectronic module substrate 803 (i.e., with an intervening layer such as a thin layer of adhesive).

The detector assembly dimension 814 may be considered in this example as the distance between the detector optical assembly 804 and the active sensor region 808. In this example, the detector assembly dimension 814 must correspond to a focal length of the detector optical assembly 804. That is, the focal length of the detector optical assembly 804 must be incident (i.e., in focus) on the active sensor region 808 of the sensor 806. However, variations in manufacturing of the detector optical assembly 804, and/or the detector optical assembly barrel 805, and/or the components that comprise the detector optical assembly barrel 805 such as the detector alignment feature 811 and the transmissive panel 809, may give rise to a variation in the detector assembly dimension 814 and/or the focal length of the detector optical assembly 804. Accordingly, the focal length may not correspond to the detector assembly dimension 814. Material may be removed from the detector alignment feature surface 812; for example, material may be machined, cut, abraded, ground, and/or etched. Further material may be removed by laser cutting and/or micro-machining. Sufficient material may be removed from the detector alignment feature surface 812 such that the dimension of the detector alignment feature 811 permits the detector assembly dimension 814 to correspond to the focal length of the detector optical assembly 804.

The emitter assembly 802 of the optoelectronic module 800 is composed of an emitter 815, which is an example of a second active optoelectronic component, that produces emitted light 816. The emitter 815 may be a vertical-cavity surface-emitting laser (VCSEL), light emitting diode (LED), or other light emitting device. Emitted light 816 may be any wavelength or range of wavelengths of electromagnetic radiation (e.g., visible or non-visible radiation). For example, emitted light 816 may be near-, mid-, or far-infrared radiation. Further the emitted light 816 may be modulated in some cases. The emitted light 816 is incident on an emitter optical assembly 817, which is an example of a second optical assembly. The emitter optical assembly 817 has an emitter optical assembly axis 829, which is an example of a second assembly optical axis. An emitter assembly dimension 118 may be considered in this example as the distance between the emitter 815 and the emitter optical assembly 817. The emitter optical assembly 817 may be any one of, or combinations of any one of, the following optical elements: a diffraction grating, a microlens array, a lens, a prism, a micro-prism array, a diffractive optical element or a plurality of anyone of the aforementioned or their respective combinations. The emitter optical assembly 817 may further be composed of apertures, spacers, alignment features, and other components pertinent to its function and apparent to one of ordinary skill in the art. The emitted light 816 incident on the emitter optical assembly 817 may produce an emission 819. The emission 819 may take the form of a pattern of high-contrast features, for example, a discrete array of illuminated dots, lines, or other shapes, or combinations of the aforementioned. The distance between the high-contrast features may be strongly correlated with the intended application of the optoelectronic module 800; generally, the distance between the features may be on the order of the dimension of the objects in the scene or smaller. Further the emission 819 may produce a homogenous (e.g., non-patterned/non-discrete illumination). The emitter optical assembly 817 is integrated into a cap 820, which is an example of a second optical barrel assembly. The cap 820 also includes a first emitter alignment feature 821, which is an example of a second alignment feature, wherein a first emitter alignment feature surface 822, which is an example of a second alignment feature, is in contact with the optoelectronic module substrate 803. The first emitter alignment feature 821 establishes the magnitude of the emitter assembly dimension 818, which is an example of a second assembly dimension.

The emitter assembly dimension 818 may be considered in this example as the distance between the emitter optical assembly 817 and the optoelectronic module substrate 803. In this example, the emitter assembly dimension 818 must correspond to a back focal length of the emitter optical assembly 817. However, variations in manufacturing of the emitter optical assembly 817 and the cap 820, for example, may give rise to a variation in the emitter assembly dimension 818 and/or the back focal length of the emitter optical assembly 817. Accordingly, the back focal length will not correspond to the emitter assembly dimension 818. Material may be removed from the first emitter alignment feature surface 822; for example, material may be machined, cut, abraded, ground, and/or etched. Further material may be removed by laser cutting and/or micro-machining. Sufficient material may be removed from the first emitter alignment feature surface 822 such that the dimension of the first emitter alignment feature 821 permits the emitter assembly dimension 818 to correspond to the back focal length of the emitter optical assembly 817.

The cap 820 further includes a second emitter alignment feature 823, which is an example of a lateral alignment feature, wherein a second emitter alignment feature surface 824, which is an example of a lateral alignment feature surface, is in contact with the detector barrel 805. The second emitter alignment feature 823 establishes a magnitude of an optical axis alignment dimension 826.

The emitter alignment feature surface 822 may be in direct contact with the optoelectronic module substrate 803 (i.e. without an intervening layer) or the emitter alignment feature surface 822 may be in indirect contact with the optoelectronic module substrate 803 (i.e. with an intervening layer such as a thin layer of adhesive). The emitter alignment feature 821 may have the shape of a thin circumferential protrusion extending from the cap 820 toward the sensor optoelectronic module substrate 803 depicted in FIG. 8. However, other shapes are possible; for example, the emitter alignment feature 821 may take the form of studs or columnar protrusions such as cylindrical, rectangular, and/or cubic protrusions.

The optoelectronic module 800 further includes adhesive 827. The adhesive 827 may be substantially non-transparent. For example, the adhesive may be non-transparent to wavelengths of light emitted by the emitter 815. Further the adhesive 827 may be non-transparent to wavelengths of light for which the sensor 806 is sensitive (e.g., if the sensor 806 is sensitive to a range of wavelengths encompassing infrared light, the adhesive 827 may be substantially non-transparent to those wavelengths of infrared light). The adhesive 827 may be in contact with the first emitter alignment feature 821 and the optoelectronic module substrate 803 where the adhesive 827 may bond the optoelectronic module substrate 803 to the first emitter alignment feature 821 and/or may provide a light-tight seal between the optoelectronic module substrate 803 and the first emitter alignment feature 821. The adhesive 827 may be in contact with the cap 820 and the detector optical assembly barrel 805 where the adhesive 827 may bond the detector optical assembly barrel 805 to the cap 820 and/or may provide a light-tight seal between the detector optical assembly barrel 805 and the cap 820. The adhesive 827 may be in contact with the detector alignment feature 811 and the sensor substrate 807 where the adhesive 827 may bond the sensor substrate 807 to the detector alignment feature 811 and/or may provide a light-tight seal between the sensor substrate 807 and the detector alignment feature 811. Still further, in instances where 811 takes the form of studs, columnar protrusions, and/or other geometric protrusions adhesive 827 may be located around the periphery of the sensor 806; that is, on the sensor substrate 807 outside of the active sensor region 808. In such instances, the adhesive 827 may function as a light-tight seal. Still further in instances where the first emitter alignment feature 821 may take the form of studs, columnar protrusions, and/or other geometric protrusions adhesive 827 may be located around the periphery of the optoelectronic module substrate 803. In such instances, the adhesive 827 may function as a light-tight seal.

The optoelectronic modules described in the above examples may further include, processors, other electrical components or circuit elements (e.g., transistors, resistors, capacitive and inductive elements) pertinent to the function of the optoelectronic modules and apparent to a person of ordinary skill in the art. Moreover, although the present invention has been described in detail with respect to various implementations described above, other implementations composed of combinations or subtractions of various disclosed features above, are also possible; therefore, the spirit and scope of the appended claims should not be limited to the description of the foregoing implementations. Accordingly, other implementations are within the scope of the claims.

What is claimed is:

1. An optoelectronic module comprising:
a substrate on which are mounted a first active optoelectronic component and a second active optoelectronic component, each of which is configured to emit or detect light at a particular one or more wavelengths;
a first optical assembly barrel including a first optical assembly over the first active optoelectronic component, wherein the first optical assembly barrel is laterally surrounded by a second optical barrel assembly;
the second optical barrel assembly including a second optical assembly over the second active optoelectronic component, wherein the second optical assembly is surrounded laterally by sections of the second optical barrel assembly that are substantially non-transparent to the one or more wavelengths of light;
a first alignment feature separating the first optical assembly barrel from the substrate, wherein the first alignment feature establishes a first assembly dimension with respect to the first optical assembly independent of a second assembly dimension;
a second alignment feature separating the second optical barrel assembly from the substrate, wherein the second alignment feature establishes the second assembly dimension with respect to the second optical assembly.

2. The optoelectronic module of claim 1 further comprising a lateral alignment feature separating the first optical assembly barrel from the second optical barrel assembly.

3. The optoelectronic module of claim 1 wherein a surface of the first alignment feature is in direct contact with a surface of the substrate.

4. The optoelectronic module of claim 1 wherein a surface of the first alignment feature is in direct contact with a surface of the first active optoelectronic component.

5. The optoelectronic module of claim 1 wherein a surface of the first alignment feature is separated from a surface of the first active optoelectronic component by an intervening layer.

6. The optoelectronic module of claim 1 wherein the first assembly dimension is a focal length of the first optical assembly over the first active optoelectronic assembly component, and the second assembly dimension is a focal length of the second optical assembly over the second active optoelectronic component.

7. The optoelectronic module of claim 1 wherein the first alignment feature is a protrusion extending from the first optical assembly barrel.

8. The optoelectronic module of claim 1 wherein the second alignment feature is a protrusion extending from the second optical barrel assembly.

9. The optoelectronic module of claim 1 wherein the second optical assembly is supported by an edge surface of the second optical barrel assembly.

10. The optoelectronic module of claim 1 wherein the second optical assembly comprises at least one of a diffraction grating, a microlens array, a lens, a prism, a micro-prism array, or a diffractive optical element.

11. An optoelectronic module comprising:
a substrate on which are mounted a first active optoelectronic component, a second active optoelectronic component, and a third active optoelectronic component, each of which is configured to emit or detect light at a particular one or more wavelengths;
a first optical assembly barrel including a first optical assembly over the first active optoelectronic component, wherein the first optical assembly barrel is laterally surrounded by a second optical barrel assembly;
the second optical barrel assembly including a second optical assembly over the second active optoelectronic component and a third optical assembly over the third active optoelectronic component, wherein the second optical assembly and the third optical assembly are surrounded laterally by sections of the second optical barrel assembly that are substantially non-transparent to the one or more wavelengths of light;
a second alignment feature separating the second optical barrel assembly from the substrate, wherein the second alignment feature establishes a second assembly dimension with respect to the second optical assembly and a third assembly dimension with respect to the third optical assembly;
a first alignment feature separating the first optical assembly barrel from the substrate, wherein the first alignment feature establishes a first assembly dimension with respect to the first optical assembly independent of the second and third assembly dimensions.

12. A method of manufacturing an optoelectronic module, the method comprising:
applying a first optical beam to a second optical assembly laterally surrounded by sections of a second optical barrel assembly having a first alignment feature;
adjusting a height of the first alignment feature to attain a specified value for a first assembly dimension with respect to the second optical assembly;
applying a second optical beam to a first optical assembly integrated in a first optical assembly barrel;
adjusting a height of at least one feature of the first optical assembly or of the first optical assembly barrel to attain a specified value for a second assembly dimension with respect to the first optical assembly;
mounting the first optical assembly barrel including the first optical assembly over a first active optoelectronic component such that a surface of a second alignment feature of the first optical assembly barrel is in direct or indirect contact with a surface of the first active optoelectronic component; and
mounting the second optical barrel assembly, including the second optical assembly, over a substrate on which the first active optoelectronic component is mounted such that a surface of the first alignment feature is in direct or indirect contact with a surface of the substrate.

13. The method of claim 12 wherein a second active optoelectronic component is mounted on the substrate, wherein, when the second optical barrel assembly is mounted over the substrate, the second optical assembly is substantially aligned with the second active optoelectronic component.

14. The method of claim 12 wherein adjusting a height of at least one feature of the first optical assembly or of the first optical assembly barrel to attain a specified value for a second assembly dimension with respect to the first optical assembly includes:
adjusting a thickness of a transmissive layer that intersects an optical axis of the first optical assembly.

15. The method of claim 12 wherein adjusting a height of at least one feature of the first optical assembly or of the first optical assembly barrel to attain a specified value for a second assembly dimension with respect to the first optical assembly includes:
adjusting a height of the second alignment feature.

16. A method of positioning a first optical assembly within an optical barrel assembly having a through-hole therein and an edge surface to support the optical assembly, the method comprising:
applying a probe beam while moving a test optical assembly within the through-hole and determining a position for the first optical assembly;
adjusting a height of the edge surface; and
subsequently inserting the first optical assembly into the optical barrel assembly such that the first optical assembly is supported by the edge surface, the first optical assembly being an optical assembly different from the test optical assembly.

17. The method of claim 16 wherein adjusting a height of the edge surface includes removing material of the optical barrel assembly.

18. The method of claim 17 wherein removing material to adjust the height of the edge surface includes one or more of machining, mechanical cutting, abrading, grinding, etching, laser cutting or micro-machining.

19. The method of claim 17 wherein an amount of material removed from the edge surface is sufficient to achieve a specified distance between the first optical assembly and an active optoelectronic component when the optical barrel assembly is mounted over a substrate on which the active optoelectronic component is mounted.

* * * * *